United States Patent [19]
Baker et al.

[11] Patent Number: 6,026,050
[45] Date of Patent: Feb. 15, 2000

[54] METHOD AND APPARATUS FOR ADAPTIVELY ADJUSTING THE TIMING OF A CLOCK SIGNAL USED TO LATCH DIGITAL SIGNALS, AND MEMORY DEVICE USING SAME

[75] Inventors: Russel Jacob Baker; Troy A. Manning, both of Meridian, Id.

[73] Assignee: Micron Technology, Inc., Boise, Id.

[21] Appl. No.: 09/248,194

[22] Filed: Feb. 10, 1999

Related U.S. Application Data

[63] Continuation of application No. 08/890,055, Jul. 9, 1997.

[51] Int. Cl.⁷ ..................................................... G11C 7/00
[52] U.S. Cl. ........................................ 365/233; 365/236
[58] Field of Search .................................. 365/233, 236, 365/230.01, 189.01

[56] References Cited

U.S. PATENT DOCUMENTS

| | | | |
|---|---|---|---|
| 3,633,174 | 1/1972 | Griffin | 340/172.5 |
| 4,077,016 | 2/1978 | Sanders et al. | 331/4 |
| 4,096,403 | 6/1978 | Schroeder et al. | 307/362 |

(List continued on next page.)

FOREIGN PATENT DOCUMENTS

| | | |
|---|---|---|
| 0 295 515 A1 | 12/1988 | European Pat. Off. . |
| 0 406 786 A1 | 1/1991 | European Pat. Off. . |
| 0 450 871 A2 | 10/1991 | European Pat. Off. . |
| 0 476 585 A3 | 3/1992 | European Pat. Off. . |
| 0 655 741 A2 | 5/1995 | European Pat. Off. . |
| 0 655 834 A1 | 5/1995 | European Pat. Off. . |
| 0 680 049 A2 | 11/1995 | European Pat. Off. . |
| 0 703 663 A1 | 3/1996 | European Pat. Off. . |
| 0 704 848 A3 | 4/1996 | European Pat. Off. . |
| 0 704 975 A1 | 4/1996 | European Pat. Off. . |
| 0 767 538 A1 | 4/1997 | European Pat. Off. . |
| 6-1237512 | 10/1986 | Japan . |
| 2-112317 | 4/1990 | Japan . |
| 4-135311 | 5/1992 | Japan . |
| 5-136664 | 6/1993 | Japan . |
| 5-282868 | 10/1993 | Japan . |
| 0-7319577 | 12/1995 | Japan . |
| WO 94/29871 | 12/1994 | WIPO . |
| WO 95/22206 | 8/1995 | WIPO . |
| WO95/22200 | 8/1995 | WIPO . |
| WO 96/10866 | 4/1996 | WIPO . |
| WO 97/14289 | 4/1997 | WIPO . |
| WO 97/42557 | 11/1997 | WIPO . |

OTHER PUBLICATIONS

Alvarez, J. et al. "A Wide–Bandwidth Low Voltage PLL for PowerPC ™ Microprocessors" IEEE IEICE Trans. Electron., vol. E–78. No. 6, Jun. 1995, pp. 631–639.

Anonymous, "Programmable Pulse Generator", IBM Technical Disclosure Bulletin, vol. 17, No. 12, May 1975, pp. 3553–3554.

Anonymous, "Pulse Combining Network", IBM Tehnical Disclosure Bulletin, vol. 32, No. 12, May 1990, pp. 149–151.

Anonymous, "Variable Delay Digital Circuit", IBM Technical Disclosure Bulletin, vol. 35, No. 4A, Sep. 1992, pp. 365–366.

(List continued on next page.)

Primary Examiner—Vu A. Le
Attorney, Agent, or Firm—Dorsey & Whitney LLP

[57] ABSTRACT

A system for adjusting the phase of an internal clock signal relative to an external clock signal in a packetized dynamic random access memory device. The system applies a plurality of initialization packets of the memory device that are captured in a shift register responsive to a transition of the internal clock signal. However, the phase of the internal clock signal is sequentially incremented after each initialization packet has been captured in the shift register. After a plurality of initialization packets have been captured, an evaluation circuit identifies which phases of the internal clock signal clocked the shift register at the proper time to accurately capture each initialization packet. A single phase of the internal clock signal is then selected from within the range of internal clock signal phases that successfully captured initialization packets. This selected phase of the internal clock signal is used during normal operation of the memory device.

27 Claims, 17 Drawing Sheets

U.S. PATENT DOCUMENTS

| | | | |
|---|---|---|---|
| 4,404,474 | 9/1983 | Dingwall | 307/260 |
| 4,481,625 | 11/1984 | Roberts et al. | 370/85 |
| 4,511,846 | 4/1985 | Nagy et al. | 328/164 |
| 4,514,647 | 4/1985 | Shoji | 307/269 |
| 4,600,895 | 7/1986 | Landsman | 331/1 A |
| 4,638,187 | 1/1987 | Boler et al. | 307/451 |
| 4,687,951 | 8/1987 | McElroy | 307/269 |
| 4,773,085 | 9/1988 | Cordell | 375/120 |
| 4,789,796 | 12/1988 | Foss | 307/443 |
| 4,893,087 | 1/1990 | Davis | 328/14 |
| 4,902,986 | 2/1990 | Lesmeister | 331/25 |
| 4,958,088 | 9/1990 | Farah-Bakhsh et al. | 307/443 |
| 4,984,204 | 1/1991 | Sato et al. | 365/189.11 |
| 5,020,023 | 5/1991 | Smith | 364/900 |
| 5,038,115 | 8/1991 | Myers et al. | 331/2 |
| 5,086,500 | 2/1992 | Greub | 395/550 |
| 5,087,828 | 2/1992 | Sato et al. | 307/269 |
| 5,122,690 | 6/1992 | Bianchi | 307/475 |
| 5,128,560 | 7/1992 | Chern et al. | 307/475 |
| 5,128,563 | 7/1992 | Hush et al. | 307/482 |
| 5,134,311 | 7/1992 | Biber et al. | 307/270 |
| 5,150,186 | 9/1992 | Pinney et al. | 357/42 |
| 5,165,049 | 11/1992 | Hesson | 307/270 |
| 5,179,298 | 1/1993 | Hirano et al. | 307/443 |
| 5,194,765 | 3/1993 | Dunlop et al. | 307/443 |
| 5,212,601 | 5/1993 | Wilson | 360/51 |
| 5,220,208 | 6/1993 | Schenck | 307/443 |
| 5,239,206 | 8/1993 | Yanai | 307/272.2 |
| 5,243,703 | 9/1993 | Farmwald et al. | 395/325 |
| 5,254,883 | 10/1993 | Horowitz et al. | 307/443 |
| 5,256,989 | 10/1993 | Parker et al. | 331/1 A |
| 5,257,294 | 10/1993 | Pinto et al. | 375/120 |
| 5,268,639 | 12/1993 | Gasbarro et al. | 324/158 R |
| 5,274,276 | 12/1993 | Casper et al. | 307/443 |
| 5,276,642 | 1/1994 | Lee | 365/189.04 |
| 5,278,460 | 1/1994 | Casper | 307/296.5 |
| 5,281,865 | 1/1994 | Yamashita et al. | 307/279 |
| 5,283,631 | 2/1994 | Koerner et al. | 307/451 |
| 5,295,164 | 3/1994 | Yamamura | 375/120 |
| 5,311,481 | 5/1994 | Casper et al. | 365/230.06 |
| 5,311,483 | 5/1994 | Takasugi | 365/233 |
| 5,321,368 | 6/1994 | Hoelzle | 328/63 |
| 5,337,285 | 8/1994 | Ware et al. | 365/227 |
| 5,347,177 | 9/1994 | Lipp | 307/443 |
| 5,347,179 | 9/1994 | Casper et al. | 307/451 |
| 5,355,391 | 10/1994 | Horowitz et al. | 375/36 |
| 5,361,002 | 11/1994 | Casper | 327/530 |
| 5,390,308 | 2/1995 | Ware et al. | 395/400 |
| 5,400,283 | 3/1995 | Raad | 365/203 |
| 5,408,640 | 4/1995 | MacIntyre et al. | 395/550 |
| 5,410,263 | 4/1995 | Waizman | 327/141 |
| 5,416,436 | 5/1995 | Rainard | 327/270 |
| 5,420,544 | 5/1995 | Ishibashi | 331/11 |
| 5,428,311 | 6/1995 | McClure | 327/276 |
| 5,430,676 | 7/1995 | Ware et al. | 365/189.02 |
| 5,432,823 | 7/1995 | Gasbarro et al. | 375/356 |
| 5,438,545 | 8/1995 | Sim | 365/189.05 |
| 5,440,260 | 8/1995 | Hayashi et al. | 327/278 |
| 5,440,514 | 8/1995 | Flannagan et al. | 365/194 |
| 5,446,696 | 8/1995 | Ware et al. | 365/222 |
| 5,448,193 | 9/1995 | Baumert et al. | 327/156 |
| 5,451,898 | 9/1995 | Johnson | 327/563 |
| 5,457,407 | 10/1995 | Shu et al. | 326/30 |
| 5,465,076 | 11/1995 | Yamauchi et al. | 331/179 |
| 5,473,274 | 12/1995 | Reilly et al. | 327/159 |
| 5,473,575 | 12/1995 | Farmwald et al. | 365/230.06 |
| 5,473,639 | 12/1995 | Lee et al. | 375/376 |
| 5,485,490 | 1/1996 | Leung et al. | 375/371 |
| 5,488,321 | 1/1996 | Johnson | 327/66 |
| 5,489,864 | 2/1996 | Ashuri | 327/161 |
| 5,497,127 | 3/1996 | Sauer | 331/17 |
| 5,498,990 | 3/1996 | Leung et al. | 327/323 |
| 5,506,814 | 4/1996 | Hush et al. | 365/230.03 |
| 5,508,638 | 4/1996 | Cowles et al. | 326/38 |
| 5,513,327 | 4/1996 | Farmwald et al. | 395/309 |
| 5,539,345 | 7/1996 | Hawkins | 327/150 |
| 5,544,203 | 8/1996 | Casasanta et al. | 375/376 |
| 5,552,727 | 9/1996 | Nakao | 327/159 |
| 5,568,075 | 10/1996 | Curran et al. | 327/172 |
| 5,568,077 | 10/1996 | Sato et al. | 327/199 |
| 5,572,557 | 11/1996 | Aoki | 375/376 |
| 5,574,698 | 11/1996 | Raad | 365/230.06 |
| 5,576,645 | 11/1996 | Farwell | 327/94 |
| 5,577,236 | 11/1996 | Johnson et al. | 395/551 |
| 5,578,940 | 11/1996 | Dillon et al. | 326/30 |
| 5,578,941 | 11/1996 | Sher et al. | 326/34 |
| 5,579,326 | 11/1996 | McClure | 371/61 |
| 5,581,197 | 12/1996 | Motley et al. | 326/30 |
| 5,589,788 | 12/1996 | Goto | 327/276 |
| 5,590,073 | 12/1996 | Arakawa et al. | 365/185.08 |
| 5,594,690 | 1/1997 | Rothenberger et al. | 365/189.01 |
| 5,614,855 | 3/1997 | Lee et al. | 327/158 |
| 5,619,473 | 4/1997 | Hotta | 365/238.5 |
| 5,621,340 | 4/1997 | Lee et al. | 327/65 |
| 5,621,690 | 4/1997 | Jungroth et al. | 365/200 |
| 5,621,739 | 4/1997 | Sine et al. | 371/22.1 |
| 5,627,780 | 5/1997 | Malhi | 365/185.09 |
| 5,627,791 | 5/1997 | Wright et al. | 365/222 |
| 5,631,872 | 5/1997 | Naritake et al. | 365/227 |
| 5,636,163 | 6/1997 | Furutani et al. | 365/189.01 |
| 5,636,173 | 6/1997 | Schaefer | 365/230.03 |
| 5,636,174 | 6/1997 | Rao | 365/230.03 |
| 5,638,335 | 6/1997 | Akiyama et al. | 365/230.03 |
| 5,657,481 | 8/1997 | Farmwald et al. | 395/551 |
| 5,668,763 | 9/1997 | Fujioka et al. | 365/200 |
| 5,692,165 | 11/1997 | Jeddeloh et al. | 395/551 |
| 5,694,065 | 12/1997 | Hamasaki et al. | 327/108 |
| 5,712,580 | 1/1998 | Baumgartner et al. | 327/12 |
| 5,719,508 | 2/1998 | Daly | 327/12 |
| 5,740,123 | 4/1998 | Uchida | 365/233 |
| 5,751,665 | 5/1998 | Tanoi | 368/120 |
| 5,789,947 | 8/1998 | Sato | 327/3 |
| 5,926,436 | 7/1999 | Toda et al. | 365/236 |

OTHER PUBLICATIONS

Arai, Y. et al., "A CMOS Four Channel x1K Time Memory LSI with 1–ns/b Resolution", IEEE Journal of Solid–State Circuits, vol. 27, No. 3, M, 8107 Mar., 1992, No. 3, New York, US, pp. 359–365 and pp. 528–531.

Arai, Y. et al., "A Time Digitizer CMOS Gate–Array with a 250 ps Time Resolution", XP 000597207, IEEE Journal of Solid–State Circuits, vol. 31, No. 2, Feb. 1996, pp. 212–220.

Aviram, A. et al., "Obtaining High Speed Printing on Thermal Sensitive Special Paper With a Sensitive Ribbon Print Head", IBM Technical Disclosure Bulletin, vol. 27, No. 5, Oct. 1984, pp. 3059–3060.

Bazes, M., "Two Novel Fully Complementary Self–Biased CMOS Differential Amplifiers", IEEE Journal of Solid–State Circuits, vol. 26, No. 2, Feb 1991, pp. 165–168.

Chapman, J. et al., "A Low–Cost High–Performance CMOS Timing Vernier for ATE", IEEE International Test Conference, Paper 21.2, 1995, pp. 459–468.

Cho, J. "Digitally–Controlled PLL with Pulse Width Detection Mechanism for Error Correction", ISSCC 1997, Paper No. SA 20.3, pp. 334–335.

Christiansen, J., "An Integrated High Resolution CMOS Timing Generator Based on an Array of Delay Locked Loops", IEEE Journal of Solid–State Circuits, vol. 31, No. 7, Jul. 1996, pp. 952–957.

Combes, M. et al., "A Portable Clock Multiplier Generator Using Digital CMOS Standard Cells", IEEE Journal of Solid–State Circuits, vol. 31, No. 7, Jul. 1996, pp. 958–965.

Descriptive literature entitled, "400MHz SLDRAM, 4M ×16 SLDRAM Pipelined, Eight Bank, 2.5 V Operation," SLDRAM Consortium Advance Sheet, published throughout the United States, pp. 1–22.

Donnelly, K. et al., "A 660 MB/s Interface Megacell Portable Circuit in 0.3 μm–0.7 μm CMOS ASIC", IEEE Journal of Solid–State Circuits, vol. 31, No. 12, Dec. 1996, pp. 1995–2001.

"Draft Standard for a High–Speed Memory Interface (SyncLink)", Microprocessor and Microcomputer Standards Subcommittee of the IEEE Computer Society, Copyright 1996 by the Institute of Electrical and Electronics Engineers, Inc., New York, NY, pp. 1–56.

Goto, J. et al., "A PLL–Based Programmable Clock Generator with 50–to 350–MHz Oscillating Range for Video Signal Processors", IEICE Tans. Electron., vol. E77–C, No. 12, Dec. 1994, pp. 1951–1956.

Hamamoto, T., "400–MHz Random Column Operating SDRAM Techniques with Self–Skew Compensation", IEEE Journal of Solid–State Circuits, vol. 33, No. 5, May 1998, pp. 770–778.

Ishibashi, A. et al., "High–Speed Clock Distribution Architecture Employing PLL for 0.6μm CMOS SOG", IEEE Custom Integrated Circuits Conference, 1992, pp. 27.6.1–27.6.4.

Kim, B. et al., "A 30MHz High–Speed Analog/Digital PLL in 2μm CMOS", ISSCC, Feb. 1990.

Kikuchi, S. et al., "A Gate–Array–Based 666MHz VLSI Test System", IEEE International Test Conference, Paper 21.1, 1995, pp. 451–458.

Ko, U, et al., "A 30–ps Jitter, 3.6–μs Locking, 3.3–Volt Digital PLL For CMOS Gate Arrays", IEEE Custom Integrated Circuits Conference, 1993, pp. 23.3.1–23.3.4.

Lee, T. et al., "A 2.5V Delay–Locked Loop for an 18Mb 500MB/s DRAM", IEEE International Solid–State Circuits Conference Digest of Technical Papers, Paper No. FA 18.6, 1994, pp. 300–301.

Lesmeister, G., "A Densely Integrated High Performance CMOS Tester", International Test Conference, Paper 16.2, 1991, pp. 426–429.

Ljuslin, C. et al., "An Integrated 16–channel CMOS Time to Digital Converter", IEEE Nuclear Sciences Symposium & Medical Imaging Conference Record, vol. 1, 1993, pp. 625–629.

Maneatis, J., "Low–Jitter Process–Independent DLL and PLL Based on Self–Biased Techniques", IEEE Journal of Solid–State Circuits, vol. 31, No. 11, Nov. 1996, pp. 1723–1732.

Nakamura, M. et al., "A 156 Mbps CMOS Clock Recovery Circuit for Burst–mode Transmission", Symposium on VLSI Circuits Digest of Technical Papers, 1996, pp. 122–123.

Nielson, E., "Inverting latches make simple VCO", EDN, Jun. 19, 1997.

Novof, I. et al., "Fully Integrated CMOS Phase–Locked Loop with 15 to 240 MHz Locking Range and ±50 ps JItter", IEEE Journal of Solid–State Circuits, vol. 30, No. 11, Nov. 1995, pp. 1259–1266.

Santos, D. et al., "A CMOS Delay Locked Loop And Sub–Nanosecond Time–to–Digital Converter Chip", IEEE Nuclear Science Symposium and Medical Imaging Conference Record, vol. 1 Oct. 1995, pp. 289–291.

Saeki, T. et al., "A 2.5–ns Clock Access, 250–MHz 256–Mb SDRAM with Synchronous Mirror Delay", IEEE Journal of Solid–State Circuits, vol. 31, No. 11, Nov. 1996, pp. 1656–1665.

Shirotori, T. et al., "PLL–based, Impedance Controlled Output Buffer", 1991 Symposium on VLSI Circuits Digest of Technical Papers, pp. 49–50.

Sidiropoulos, S. et al., "A 700–Mb/s/pin CMOS Signaling Inteface Using Current Integrating Receivers", IEEE Journal of Solid–State Circuits, vol. 32, No. 5, May 1997, pp. 681–690.

Sidiropoulos, S. et al., "A CMOS 500 Mbps/pin synchronous point to point link inteface", IEEE Synposium on VLSI Circuits Digest of Technical Papers, 1994, pp. 43–44.

Sidiropoulos, S. et al., "A Semi–Digital DLL with Unlimited Phase Shift Capability and 0.08–400MHz Operating Range, "IEEE International Solid State Circuits Conference, Feb. 8, 1997, pp. 332–333.

Soyuer, M. et al., "A Fully Monolithic 1.25GHz CMOS Frequency Synthesizer", IEEE Symposium on VLSI Circuits Digest of Technical Papers, 1994, pp. 127–128.

Taguchi, M. et al., "A 40–ns 64–Mb DRAM with 64–b Parallel Data Bus Architecture", IEEE Journal of Solid–State Circuits, vol. 26, No. 11, Nov. 1991, pp. 1493–1497.

Tanoi, S. et al., "A 250–622 MHz Deskew and Jitter–Suppressed Clock Buffer Using a Frequency– and Delay–Locked Two–Loop Architecture", 1995 Symposium on VLSI Circuits Digest of Technical Papers, vol. 11, No. 2, pp. 85–86.

Tanoi, S. et al., "A 250–622 MHz Deskew and Jitter–Suppressed Clock Buffer Using Two–Loop Architecture", IEEE IEICE Trans. Electron., vol. E–79–C. No. 7, Jul. 1996, pp. 898–904.

von Kaenel, V. et al., "A 320 MHz, 1.5 mW @ 1.35 V CMOS PLL for Microprocessor Clock Generation", IEEE Journal of Solid–State Circuits, vol. 31, No. 11, Nov. 1996, pp. 1715–1722.

Watson, R. et al., "Clock Buffer Chip with Absolute Delay Regulation Over Process and Environmental Variations", IEEE Custom Integrated Circuits Conference, 1992, pp. 25.2.1–25.2.5.

Yoshimura, T. et al., "A 622–Mb/s Bit/Frame Synchronizer for High–Speed Backplane Data Communication", IEEE Journal of Solid–State Circuits, vol. 31, No. 7, Jul. 1996, pp. 1063–1066.

METHOD AND APPARATUS FOR ADAPTIVELY ADJUSTING THE TIMING OF A CLOCK SIGNAL USED TO LATCH DIGITAL SIGNALS, AND MEMORY DEVICE USING SAME

CROSS-REFERENCE TO RELATED APPLICATION

This application is a continuation of pending U.S. patent application Ser. No. 08/890,055, filed Jul. 9, 1997.

TECHNICAL FIELD

The present invention relates to integrated circuit devices, and more particularly, to adjusting the timing of an internal clock signal derived from an external clock signal so that it can be used to latch an external digital signal at the optimum time.

BACKGROUND OF THE INVENTION

Conventional computer systems include a processor coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium Pro® microprocessors are currently available that operate at clock speeds of at least 200 MHz. However, the remaining components of the computer system, with the exception of SRAM cache memory, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, and the input devices, output devices, and data storage devices are coupled to the processor bus through a bus bridge. The memory controller allows the system memory devices to operate at a clock frequency that is substantially lower than the clock frequency of the processor. Similarly, the bus bridge allows the input devices, output devices, and data storage devices to operate at frequency that is a substantially lower than the clock frequency of the processor. Currently, for example, a processor having a 200 MHz clock frequency may be mounted on a mother board having a 66 MHz clock frequency for controlling the system memory devices and other components.

Access to system memory is a frequent operation for the processor.

The time required for the processor, operating, for example, at 200 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs, which did not require that an address be provided to the DRAM for each memory access. More recently, synchronous dynamic random access memories ("SDRAMs") have been developed to allow the pipelined transfer of data at the clock speed of the motherboard. However, even SDRAMs are typically incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory may be coupled to the processor directly through the processor bus. Rather than requiring that separate address and control signals be provided to the system memory, SyncLink memory devices receive command packets that include both control and address information. The SyncLink memory device then outputs or receives data on a data bus that is coupled directly to the data bus portion of the processor bus.

An example of a computer system 10 using the SyncLink architecture is shown in FIG. 1. The computer system 10 includes a processor 12 having a processor bus 14 coupled to three packetized dynamic random access memory or SyncLink DRAMs ("SLDRAM") devices 16a–c. The computer system 10 also includes one or more input devices 20, such as a keypad or a mouse, coupled to the processor 12 through a bus bridge 22 and an expansion bus 24, such as an industry standard architecture ("ISA") bus or a Peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 communicates with the memory devices 16a–c via the processor bus 14 by sending the memory devices 16a–c command packets that contain both control and address information. Data is coupled between the processor 12 and the memory devices 16a–c, through a data bus portion of the processor bus 14. Although all the memory devices 16a–c are coupled to the same conductors of the processor bus 14, only one memory device 16a–c at a time reads or writes data, thus avoiding bus contention on the processor bus 14. Bus contention is avoided by each of the memory devices 16a–c on the bus bridge 22 having a unique identifier, and the command packet contains an identifying code that selects only one of these components.

The computer system 10 also includes a number of other components and signal lines which have been omitted from FIG. 1 in the interests of brevity. For example, as explained below, the memory devices 16a–c also receive an external clock signal CKEXT to provide internal timing signals, a data clock signal DCLK clocking data into or out of the memory device 16, and a FLAG signal signifying the start of a command packet.

One of the memory devices 16a is shown in block diagram form in FIG. 2. The memory device 16a includes a clock generator circuit 40 that receives a master clock signal CKEXT and generates an internal clock signal CKINT and a large number of other clock and timing signals to control the timing of various operations in the memory device 16. The memory device 16 also includes a command buffer 46 and an address capture circuit 48 which receive an internal clock signal CKINT, a command packet CA0–CA9 on a 10-bit command bus 50, and a FLAG signal on line 52. The memory controller (not shown) or other device normally transmits the command packet CA0–CA9 to the memory device 16a in synchronism with the external clock signal CKEXT. As explained above, the command packet contains control and address information for each memory transfer, and the FLAG signal identifies the start of a command packet which may include more than one 10-bit packet word. In fact, a command packet is generally in the form of a sequence of 10-bit packet words on the 10-bit command bus 50. The command buffer 46 receives the command packet from the bus 50, and compares at least a portion of the command packet to identifying data from an ID register 56 to determine if the command packet is directed to the memory device 16a or some other memory device 16b, c. If the command buffer 46 determines that the command packet is directed to the memory device 16a, it then provides a command word to a command decoder and sequencer 60. The command decoder and sequencer 60 generates a large number of internal control signals to control the operation of the memory device 16a during a memory transfer.

The address capture circuit 48 also receives the command words from the command bus 50 and outputs a 20-bit address corresponding to the address information in the command packet. The address is provided to an address sequencer 64 which generates a corresponding 3-bit bank address on bus 66, a 10-bit row address on bus 68, and a 7-bit column address on bus 70. The column address and row address are processed by column and row address paths 73, 75 as will be described below.

One of the problems of conventional DRAMs is their relatively low speed resulting from the time required to precharge and equilibrate circuitry in the DRAM array. The packetized DRAM 16a shown in FIG. 2 largely avoids this problem by using a plurality of memory banks 80, in this case eight memory banks 80a–h. After a memory read from one bank 80a, the bank 80a can be precharged while the remaining banks 80b–h are being accessed. Each of the memory banks 80a–h receive a row address from a respective row latch/decoder/driver 82a–h. All of the row latch/decoder/drivers 82a–h receive the same row address from a predecoder 84 which, in turn, receives a row address from either a row address register 86, redundant row circuit 87, or a refresh counter 88 as determined by a multiplexer 90. However, only one of the row latch/decoder/drivers 82a–h is active at any one time as determined by bank control logic 94 as a function of a bank address from a bank address register 96.

The column address on bus 70 is applied through a column address path 75 to a redundant column circuit 71 that determines if the column address corresponds to a defective address. The redundant column circuit 71 outputs either the column address or a redundant column address to a column latch/decoder 100 which supplies I/O gating signals to an I/O gating circuit 102. The I/O gating circuit 102 interfaces with columns of the memory banks 80a–h through sense amplifiers 104. Data is coupled to or from the memory banks 80a–h through the sense amplifiers 104 and I/O gating circuit 102 to a data path subsystem 108 which includes a read data path 110 and a write data path 112. The read data path 110 includes a bank of DC sense amplifiers 103 and a read latch 120 that amplify and store data from the I/O gating circuit 102. In the memory device 16a shown in FIG. 2, 64 bits of data are stored in the read latch 120. The read latch then provides four 16-bit data words to an output multiplexer 122 that sequentially supplies each of the 16-bit data words to a read FIFO buffer 124. Successive 16-bit data words are clocked through the read FIFO buffer 124 by a clock signal RCLK generated from the internal clock CKINT by a programmable delay circuit 126. The read FIFO buffer 124 sequentially applies the 16-bit words to a driver circuit 128 which, in turn, applies the 16-bit data words to a data bus 130 forming part of the processor bus 14.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144 responsive to the data clock DCLK applied to the memory device 16a on line 132. As with the external clock signal CKEXT and command packet CA0–CA9, the memory controller or other device (not shown) normally transmits the data to the memory device 16a in synchronism with the data clock signal DCLK. Thus, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80a–h through the I/O gating circuit 102 and the sense amplifiers 104.

As mentioned above, an important goal of the SyncLink architecture is to allow data transfer between a processor and a memory device to occur at a significantly faster rate. However, as the rate of data transfer increases, it becomes more difficult to maintain synchronization between signals transmitted to the memory device 16a. For example, as mentioned above, the command packet CA0–CA9 is normally transmitted to the memory device 16a in synchronism with the external clock signal CKEXT, and the data is normally transmitted to the memory device 16a in synchronism with the data clock signal DCLK. However, because of unequal signal delays and other factors, the command packet CA0–CA9 may not arrive at the memory device 16a in synchronism with the external clock signal CKEXT, and the data may not arrive at the memory device 16a in synchronism with the data clock signal DCLK. Even if these signals are actually coupled to the memory device 16a in synchronism with each other, they may loose synchronism once they are coupled to circuits within the memory device. For example, internal signals require time to propagate to various circuitry in the memory device 16a. Difference in length of the signal routing can cause differences in the times at which signals reach the circuitry. Differences in capacitive loading of signal lines can also cause differences in the times at which signals reach the circuitry. These differences in arrival times can become significant at high speeds of operation and eventually limit the operating speed of memory devices.

As mentioned above, the above-described problems are exacerbated as timing tolerances become more severe with higher data transfer rates. For example, if the internal clock CKINT derived from the external clock CKEXT does not latch the command packet CA0–CA9 at the proper time, errors in the operation of the memory device may result. Similarly, if the data clock DCLK does not latch the data applied to the memory device at the proper time, data errors may result.

Unfortunately, there has heretofore been no suitable means for ensuring that digital signals, such the command packets CA0–CA9 and digital signals, are latched in memory devices, such as the packetized DARM shown in FIG. 2, at the proper time at very high data transfer rates.

Although the foregoing discussion is directed to the need for faster command buffers in packetized DRAMs, similar problems exist in other memory devices, such as asynchronous DRAMs and synchronous DRAMs, which must process control and other signals at a high rate of speed.

SUMMARY OF THE INVENTION

Although the inventive system for adaptively adjusting the timing of an internal clock signal may be used in any integrated circuit, it is particularly well adapted for use in a memory device, such as a packetized dynamic random access memory device, to control the latching of commands applied to the memory device. The invention may be embodied in a variety of systems that adaptively adjust the phase of an internal clock signal relative to an external clock signal. The systems may operate by repetitively receiving a digital signal each of which is latched responsive to respective phases of the internal clock signal. The latched digital signals are then examined to determine if they were correspond to the received digital signals. A phase of the internal clock signal is then selected from within the range of phases of the internal clock signal that accurately latched the respective digital signals. The system preferably includes a clock generator circuit that generates the internal clock signal. The internal clock signal has a phase relative to the external clock signal determined by a phase command signal. The internal clock signal triggers a latch circuit, such as a shift register. The latch circuit is coupled to one of the input terminals of the integrated circuit so that the latch stores an input signal applied to the input terminal responsive to a transition of the internal clock signal. The timing control system also includes a load control circuit generating a plurality of phase command signals responsive to storing a plurality of respective input signals in the latch. Each of the phase command signals corresponds to different respective phases of the internal clock signal. An evaluation circuit coupled to the latch receives a plurality of latched signals and determines if each of the latched signals was accurately captured by the latch. The evaluation circuit generates a plurality of respective results signals indicative of whether each of the latched signals was accurately captured by the latch. The results signals are then stored in a register that is coupled to the evaluation circuit and the load control circuit. An analysis circuit coupled to the register examines the results signals stored in the register and, based on the examination of the stored results signals, generates and continuously applies to the clock generator circuit the phase command signal.

DETAILED DESCRIPTION OF THE INVENTION

Figure 2:
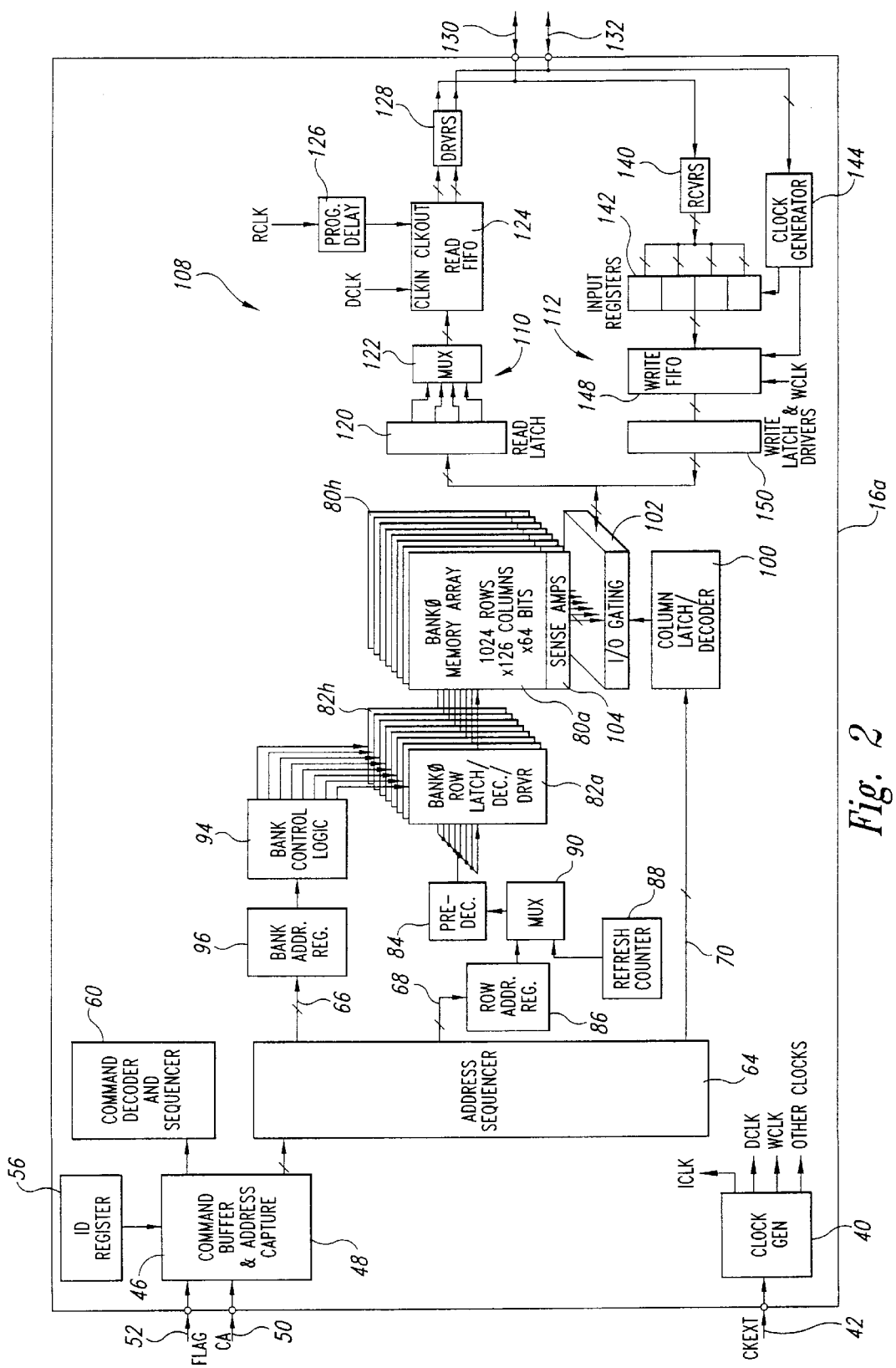
FIG. 2 is a block diagram of a conventional packetized DRAM used in the computer system of FIG. 1.
Figure 3:
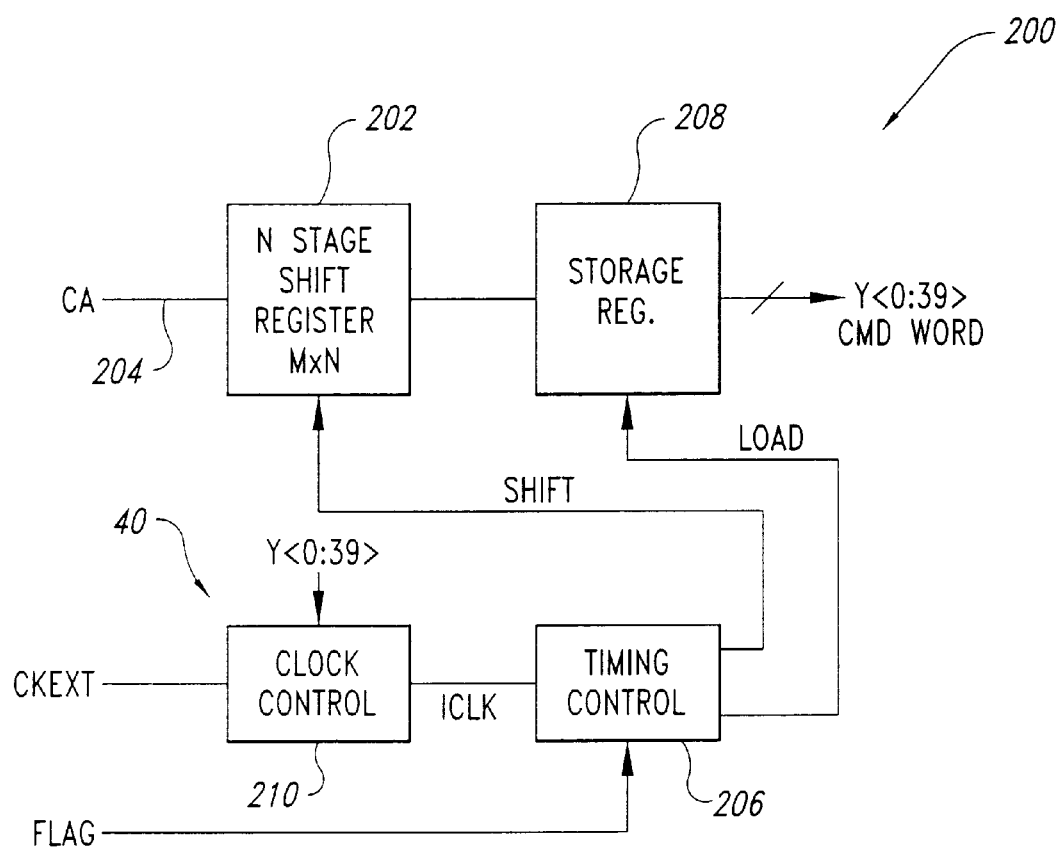
FIG. 3 is a block diagram of a preferred embodiment of a portion of a command buffer and clock generator circuit in accordance with the invention that is usable in the packetized DRAM of FIG. 2.

One embodiment of a command buffer and clock control circuit 200 in accordance with the invention is illustrated in FIG. 3. The command buffer and clock control circuit 200 can be used in place of the command buffer 46 and clock generator 40 in FIG. 2, and the resulting memory device may be used in the computer system shown in FIG. 1. With reference to FIG. 3, a command packet CA consisting of a plurality of packet words is applied to a shift register 202 via a command bus 204. The width of the bus 204 corresponds to the size of the shift register 202, and the number of packet words in the command packet corresponds to the number of stages of the shift register 202. In the embodiment shown in FIG. 3, the shift register 202 has four stages, each of which is 10 bits wide. Thus, the shift register 202 sequentially receives four 10-bit packet words CA<0:9>. Each of the four packet words is shifted into the shift register 202, and from one shift register stage to the next, responsive to each of a plurality of SHIFT pulses.

Coincident with the start of a four packet word command packet, a FLAG signal is applied to a timing control circuit 206. The FLAG signal enables the timing control circuit 206 to generate the SHIFT pulses responsive to the internal clock signal ICLK. After four packet words have been shifted into the shift register 202, the control circuit 206 generates a LOAD signal that is applied to a storage register 208. The storage register 208 is then loaded with all of the data stored in the shift register 202. In the embodiment shown in FIG. 3 in which four 10-bit packet words are shifted into the shift register 202, the storage register 208 receives and stores a 40-bit command word. However, in the more general case, the shift register 202 has N stages, each of which has a width of M bits, and the storage register 208 loads an M*N bit command word. After the storage register 208 has been loaded, it continuously outputs the M*N bit command word Y<0:39>.

As explained above, at high operating speeds, it is important that the SHIFT signal be applied to the shift register 202 at the proper time so that it latches signals on the command bus 204 when valid packet words are present on the command bus 204. If, for example, the shift register 202 is clocked by SHIFT pulses during a transition from one packet word to the next, spurious data will be shifted into the shift register 202. It is particularly difficult to ensure that the SHIFT pulses are generated at the proper time because the propagation delay of both the external clock signal CKEXT and the command packet CA is difficult to either predict or control. Furthermore, even if the propagation delay of both the external clock signal CKEXT and the command packet CA could be precisely controlled, it would be difficult to precisely control or predict the propagation delay of these signals within a memory device using the command buffer and clock generator circuit 200.

The command buffer and clock generator circuit 200 illustrated in FIG. 3 is able to precisely control the timing of the SHIFT pulses using a clock control circuit 210 which generates the internal clock signal ICLK from the external clock signal CKEXT. More specifically, the clock control circuit 210 adaptively external clock signal CKEST and generating the internal clock signal ICLK so that the SHIFT pulses are applied to the shift register 202 at the proper time. As explained in greater detail below, during initialization of a memory device using the command buffer and clock generator circuit 200, an initialization packet having a known data pattern is repetitively applied to the shift register 202 along with the external clock signal CKEST and the FLAG signal. After the four packet words of each initialization packet have been shifted into the shift register 202 and stored in the storage register 208, the bits of each packet word are applied to the clock control circuit 210. The clock control circuit 210 then determines if the shift register was successful in capturing the initialization packet. After determining whether each initialization packet was successfully captured by the shift register 202, the clock control circuit alters the delay between receipt of the external clock signal CKEST and generating the internal clock signal ICLK. The clock control circuit 210 then once again determines if the packet words of the initialization packet were successfully captured. After repeating this procedure several times, the clock control circuit determines what delay values between CKEXT and ICLK are successful in capturing the initialization packet. The clock control circuit then uses one of these delay values as the delay between CKEXT and ICLK during normal operation of a memory device using the command buffer and clock generator circuit 200. In this manner, the clock control circuit 210 adapts to whatever external or internal delays exist in the coupling of the command packet CA and the external clock CKEXT, thereby allowing the command buffer and clock generator circuit 200 to operate at optimum speed. A similar system may be used to ensure that the data is latched into the memory device 16a responsive to the data clock DCLK (FIG. 2).

It will be understood that necessary portions of the command buffer and clock generator circuit 200 have been omitted from FIG. 3 in the interests of brevity since they are somewhat peripheral to the claimed invention. For example, the command buffer and clock generator circuit 200 will contain circuitry for allowing the command buffer to determine if a command packet is directed to it, circuitry for pipelining command words output from the storage register 208, circuitry for generating lower level command signals from the command word, etc.

Figure 4:
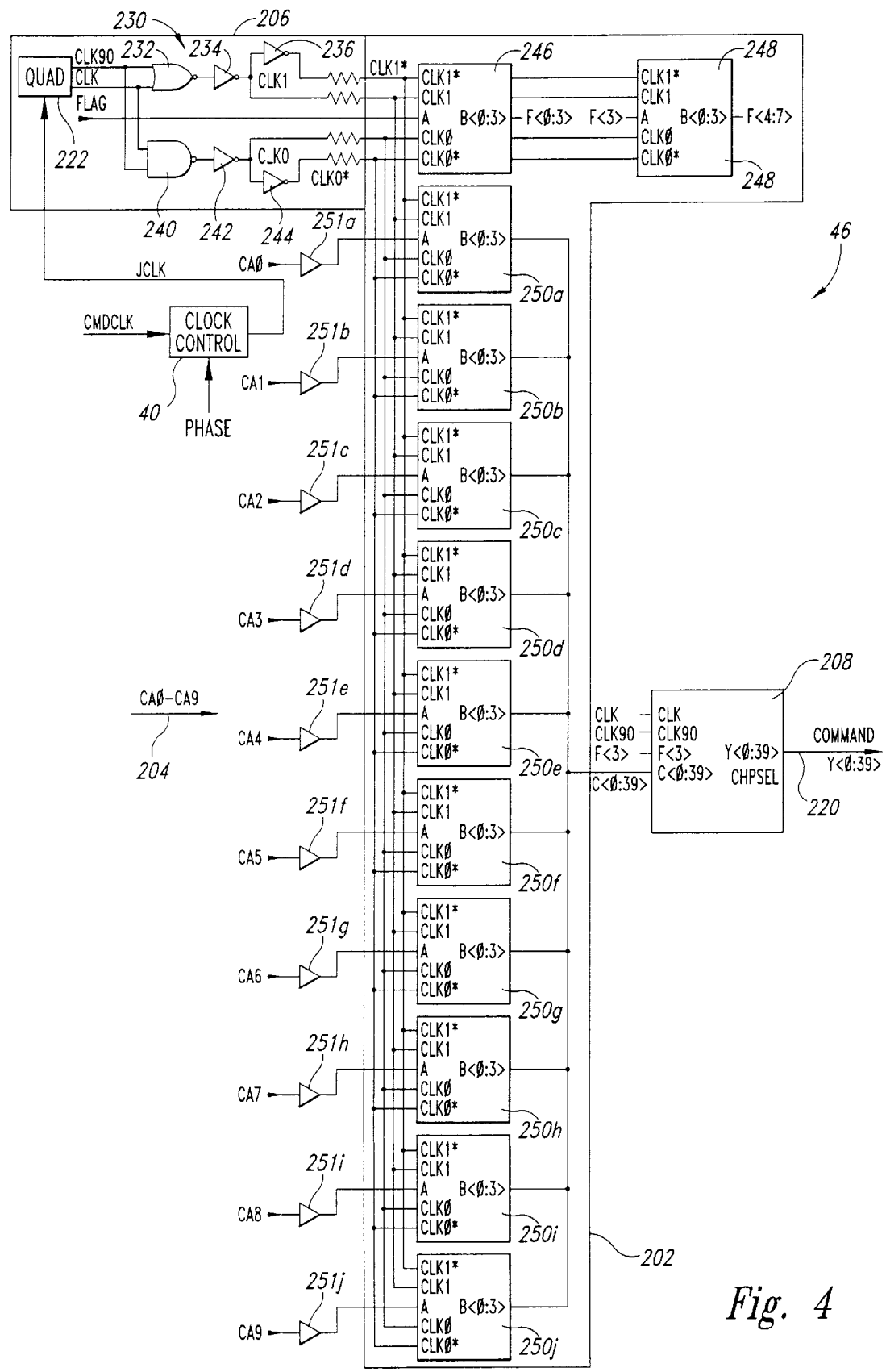
FIG. 4 is a more detailed block diagram of the portion of the command buffer and clock generator circuit shown in FIG. 3.

The relevant portions of the command buffer and clock generator circuit 200 are shown in greater detail in the block diagram of FIG. 4. As shown in FIG. 4, the timing control circuit 206 includes a clock circuit 220 that receives a clock signal CLK and its quadrature CLK90 from a conventional quadrature circuit 222 responsive to the internal clock signal ICLK. The internal clock signal ICLK is generated by the clock control circuit 210 from the external clock signal EXCLK, as explained above with reference to FIG. 3. The structure and operation of the clock control circuit 210 will be explained in detail with reference to FIGS. 5 and 6. The CLK and CLK90 signals are applied to a NOR gate 232 which outputs a high whenever ICLK and ICLK90 are both low. The output of the NOR gate 232 is applied through a first inverter 234 to generate a CLK1 signal and then through a second inverter 236 to generate a CLK1* signal (the "*" symbol after a signal name is used throughout to designate the compliment of the signal).

The CLK90 and CLK signals are also applied to a NAND gate 240 which outputs a low whenever both CLK and CLK90 are high. The output of the NAND gate 240 is coupled through an inverter 242 to generate a CLK0 signal and then through a second inverter 244 to generate a CLK0* signal. These CLK0, CLK0*, CLK1, and CLK1* signals correspond to the SHIFT pulses described with reference to FIG. 3.

The clock circuit 220 also includes a pair of shift register circuits 246, 248 that are connected in series with each other to form an 8-stage shift register. The shift register circuit 246 receives the FLAG signal, and the FLAG signal is then sequentially shifted through the four stages of the shift register circuit 246 and the four stages of the shift register circuit 248 responsive to the CLK0, CLK0*, CLK1, and CLK1* signals. The FLAG signal is shifted through two stages of the shift register circuits 246, 248 each cycle of the CLK signals. Thus, when FLAG goes high, two successive F<0:7> outputs of the shift register circuits 246, 248 sequentially go high each clock cycle.

The shift register 202 shown in FIG. 4 includes ten separate shift register circuits 250a–j, each of which receives a respective bit CA0–CA9 of the incoming 10-bit packet word coupled through respective buffers 251a–j. Each of the shift register circuits 250a–j includes four shift register stages. Thus, after four clock cycles, four packet word bits CA have been shifted into each shift register circuit 250, and all four of these bits are available as a 4-bit word B<0:3>. Thus, the ten shift register circuits 250a–j collectively store and then output a 40-bit command word C<0:39>.

The storage register 208 also receives the CLK and CLK90 signals. However, bits B<0:3> for the four packet words stored in the shift register 202 are not latched into the storage register 208 until the F<3> signal is generated. The clock circuit 220 generates the F<3> signal four transitions of the CLK signal after receipt of the FLAG signal, i.e., after four command packets have been shifted into the shift register 202. The storage register then stores and continuously outputs the 40-bit command word Y<0:39>. The command word Y<0:39> is then used to control the operation of a memory device containing the command buffer and clock generator circuit 200. As mentioned above, the command word Y<0:39>is also used by the clock control circuit 210 to select the optimum delay between receipt of the external clock signal CKEXT and generating the internal clock signal ICLK.

Figure 5:
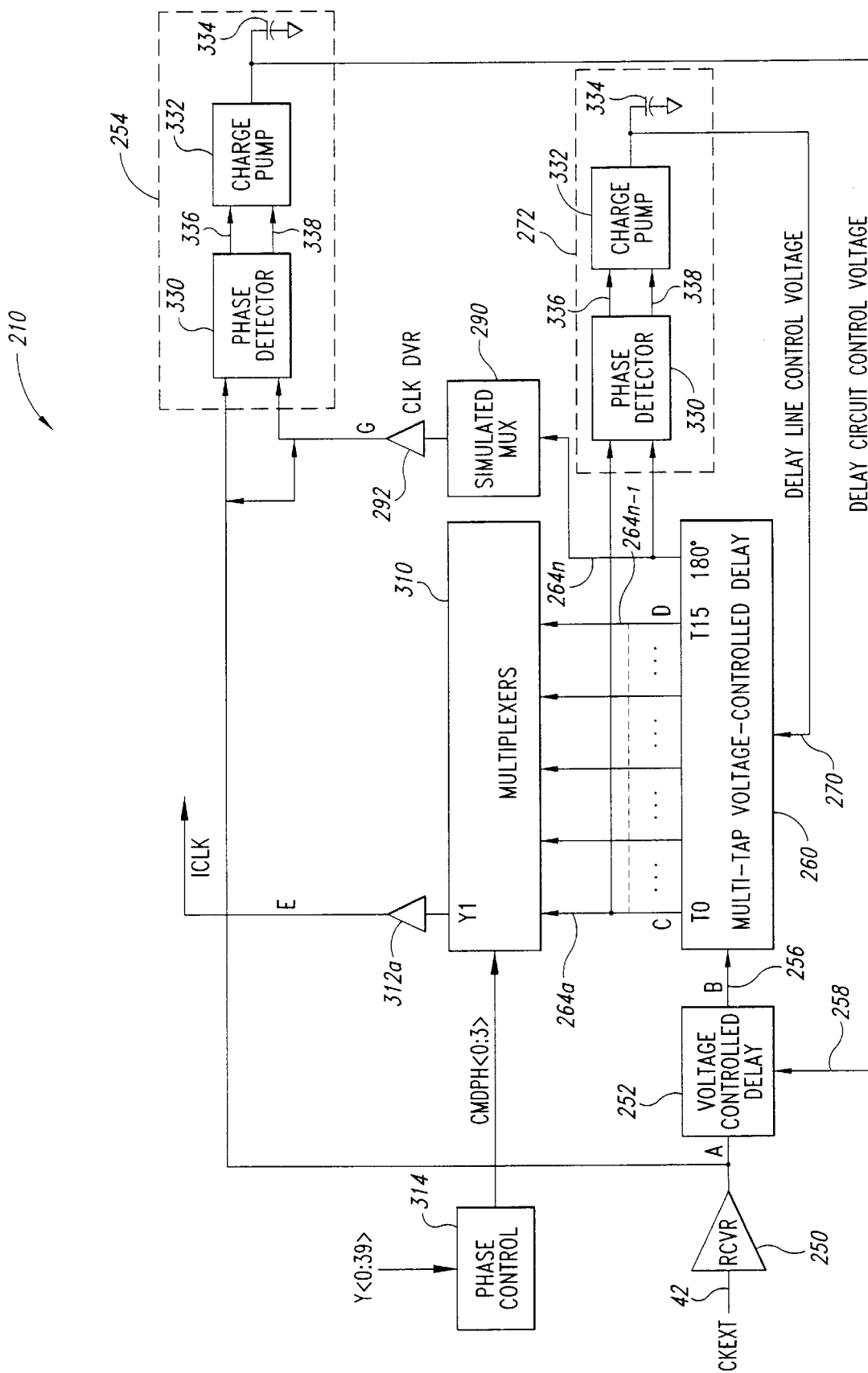
FIG. 5 is a logic diagram and block diagram of the clock control circuit used in the clock generator circuit of FIG. 4.

One embodiment of the clock control circuit 210 in accordance with the present invention, is shown in FIG. 5. As explained above, it is very difficult to clock the shift register 202 (FIGS. 3 and 4) at the proper time at the maximum speed of the command decoder 200. The function of the clock control circuit 210 is to provide an internal clock signal ICLK to the input of the quadrature circuit 222 at the proper time so that the timing control circuit 206 can clock the shift register 202 at even the fastest operating speed of the command decoder 200. However, it will be understood that the clock control circuit 210 may be used for other purposes both in dynamic random access memories and in other circuits. For example, it may be used to generate the data clock signal DCLK to accurately clock data into the memory device 16a, as explained above.

With reference to FIG. 5, the external clock CKEXT is coupled from line 42 through a receiver buffer 250 to a conventional voltage controlled delay circuit 252 and to one input of a phase detector 254. The voltage controlled delay circuit 252 couples the output of the receiver buffer 250 to an output line 256 with a delay that is a function of a control signal applied to the delay circuit 252 on line 258. Although the control signal on line 258 is an analog voltage, it will be understood that other types of control signals, including digital words, may alternatively be used. The output of the voltage controlled delay circuit 252 is applied to a multi-tap voltage controlled delay line 260.

The multi-tap voltage controlled delay line 260 couples the clock signal applied to its input on line 256 to a plurality of output lines 264a–264n. The incoming clock signal is coupled to the output lines 264 with an increasing delay from the first line 264a to the last line 264n. In the embodiment illustrated in FIG. 3, there are 17 output lines 264, but the delay line 260 may have a greater or lesser number of output lines 264. When a delay locked loop that includes the delay line 260 is locked as explained below, the signals at the first output line 264a and the last or 17th output line 264n are the inverse of each other, ie., phased 180 degrees from each other. The signals on the 17 lines are therefore delayed by 11.25 degrees more than the signal coupled to the previous line 264. Thus, the first line 264a has a relative phase of zero degrees, the 16th line 264n–1 has a phase of 168.75 degrees and the last line 264n has a phase of 180 degrees. More specifically, a control voltage applied to the delay line 260 through line 270 is adjusted so that the phase of the signal on the last line 264n relative to the phase on the first line 264a is 180 degrees. This is accomplished by applying the first line 264a and the last line 264n to respective inputs of a phase detector 272.

As mentioned above, the delay line 260 and phase detector 272 implement a first delay locked loop. When the first delay locked loop is locked, the signal on line 264n will have a phase relative to the phase of the signal on line 264a of 180 degrees. Therefore, as mentioned above, the signal on each of the output lines 264a–26n will sequentially increase from zero degrees to 180 degrees. Although the signals on lines 264a–n are equally phased apart from each other, it will be understood that equal phasing is not required.

The clock control circuit 210 also includes a second delay locked loop formed by the phase detector 254, the voltage controlled delay circuit 252 and the voltage controlled delay line 260. More particularly, the last output line 264n of the delay line 260 is applied through a simulated multiplexer circuit 290 and a clock driver 292 to one input of the phase detector 254. It will be recalled that the other input of the phase detector 254 receives the output of the receiver buffer 250. Like the phase detector 272, when the second delay locked loop is locked, the signals applied to the phase detector 254 are the inverse of each other. Thus, when the second loop is locked, the phase of the signal at the output of the clock driver 292 is 540 degrees (effectively 180 degrees) relative to the phase of the signal at the output of the receiver buffer 250.

The remaining output lines 264a–264n–1 of the delay line 260 are coupled to a multiplexer 310 having an output line coupled to clock driver 312. The multiplexer 310 couples the input of the clock driver 312 to any one of the output lines 264a–264n–1 as determined by respective four-bit phase command word CMDPH<0:3>. The four-bit phase command CMDPH<0:3> is generated by a phase control circuit 314 based on the command word Y<0:39> during an initialization procedure. The structure and operation of the phase control circuit 314 is described in detail in the remaining Figures. The clock driver 312 is used to generate the internal clock signal ICLK which is used to derive the clock signals that are applied to the clock inputs of the shift register 202 (FIGS. 3 and 4).

The phase detectors 254, 272 are each implemented using to a phase detector circuit 330, a charge pump 332 and a capacitor 334. However, other varieties of phase detectors may alternatively be used.

The phase detector circuit 330 applies either an increase signal on line 336 or a decrease signal on line 338 to respective inputs of the charge pump 332. The phase detector circuit 330 generates the increase signal on line 336 whenever the phase of a first signal on one of its inputs relative to a second signal on the other of its inputs is less than 180 degrees. As explained below, the increase signal on line 336 causes the charge pump 332 to adjust the control voltage to increase the delay of the first signal so that the phase of the first signal relative to the phase of the second signal approaches 180 degrees. The phase detector circuit 330 generates the decrease signal on line 338, in the opposite condition, i.e., when the phase of the second signal relative to the first signal is greater than 180 degrees. The decrease signal on line 338 causes the charge pump 332 to adjust the control voltage to reduce the delay of second signal toward 180 degrees.

Although the phase detector circuit 330 may be implemented in a variety of ways, it may simply use two set-reset flip-flops (not shown) for generating the increase and decrease signals, respectively. The increase flip-flop is set by the rising edge of the first signal on one of the inputs and reset by the falling edge of the second signal on the other input. Thus, the duration that the flip-flop is set, and hence the duration of the increase signal on line 336, corresponds to the period of time that the second signal must be further delayed to have a phase of 180 degrees relative to the phase of the first signal. Similarly, the flip-flop producing the decrease signal on line 338 is set by the falling edge of the second signal and reset by the rising edge of the first signal so that the duration of the decrease signal on line 338 corresponds to the time that the second signal is delayed beyond the time that it would have a phase of 180 degrees relative to the phase of the first signal.

There are also a variety of approaches for implementing the charge pump 332. However, the charge pump 332 can be implemented by simply applying a constant current to the capacitor 334 for the duration of each increase signal on line 336 and removing a constant current from the capacitor 334 for the duration of each decrease signal on line 338. Appropriate circuitry could also be included in either the phase detector circuit 330 or the charge pump 332 to provide hysteresis in a band when the first and second signals have relative phases of approximately 180 degrees from each other as will be apparent to one skilled in the art.

Figure 6:
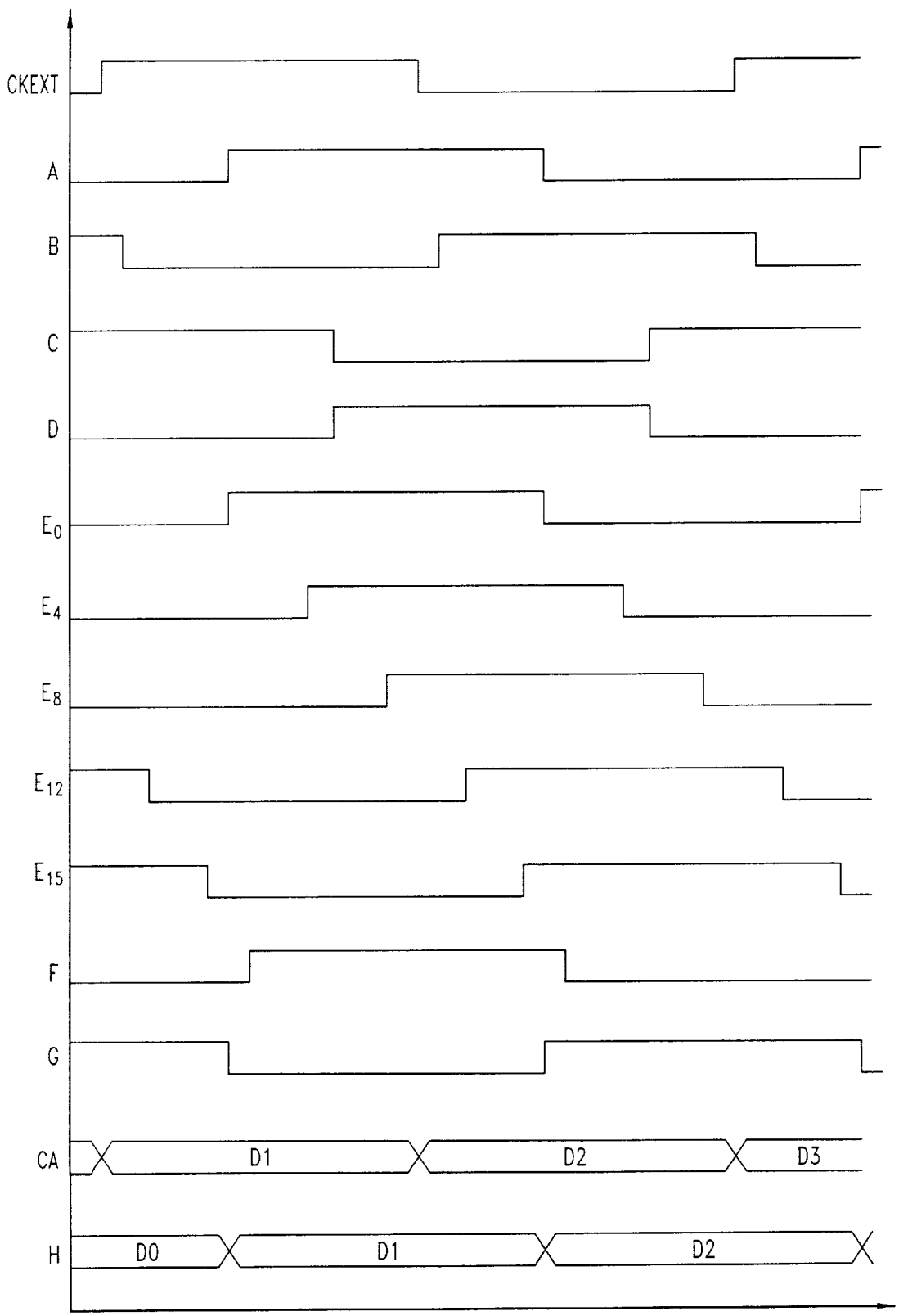
FIG. 6 is a timing diagram showing various signals present in the clock control circuit of FIG. 5.

The operation of the clock control circuit 210 of FIG. 5 in the command decoder of FIG. 4 can best be explained with reference to the timing diagram of FIG. 6. As illustrated in FIG. 6, the external clock signal CKEXT on line 42 is delayed by approximately 70 degrees in passing through the receiver buffer 250 to node A (FIG. 5). Assuming that both of the delay-lock loops are locked, the signal at the output of the receiver buffer 250 is delayed by 120 degrees in passing through the voltage controlled delay circuit 252 to node B. The signal on node B is then coupled to node C with a delay of another 120 degrees and to node D with a delay of 300 degrees so that the signals at nodes C and D are phased 180 degrees apart from each other. Since the signals at nodes C and D are compared to each other by the phase detector 272, the phase detector 272 adjusts the control voltage on line 270 to ensure that the signals at nodes C and D are phased 180 degrees from each other. The other outputs from the delay line 260 have phases relative to the phase of the signal at node C that increase 11.25 degrees for each output in sequence from the first line 264a to the last line 264n.

As mentioned above, one of the first 16 output lines 264a–264n–1 of the delay lines 260 is coupled through the multiplexer 310 and the clock driver 312 to provide the internal clock signal ICLK at node E. In passing through the multiplexer 310 and the clock driver 312a, the selected output from the delay line is delayed by another 120 degrees. Thus, the signal Eo coupled from the first output line of the delay line 260 is delayed by 120 degrees, the signal E4 from the fifth output is delayed by 165 degrees, the signal E8 from the ninth output is delayed by 210 degrees, the signal E12 from the 13th output is delayed by 255 degrees, and the signal E15 from the 16th output is delayed by 288.75 degrees. Although the output signals are coupled from the delay line 260 through the multiplexer 310 and clock driver 312a with a delay, that delay is matched by the coupling of the signal from line 264n through the simulated multiplexer 290 and clock driver 292 since the same circuit is used for the simulated multiplexer 290 as the multiplexer 310 and the clock driver 292 is identical to the clock driver 312a. For this reason, and because the phase of the signal on line 264n is 180 degrees relative to the phase of the signal on line 264a, the signal at the output of the clock driver 292 at node G has a phase relative to the phase of the signal Eo at the output of the clock 312a of 180 degrees. Since the signals applied to the inputs of the phase detector 254 are the inverse of each other when the delay-locked loop is locked, the signal Eo has substantially the same phase as the signal at the output of the receiver buffer 250. Furthermore, the delay of the voltage controlled delay circuit 252 will be adjusted so that the signal Eo always has the same phase as the command clock coupled to the output of the receiver buffer 250 at A. Assuming the each packet word in the command packet is valid on the rising edge of the external clock CKEXT signal, the packet word coupled to the shift register 202 (FIG. 4) is valid on the rising edge of ICLK since ICLK is properly phased to the signal at node A and the delay through the receiver buffer 250 is substantially the same as the delays through the buffers 251a–j. In operation, the multiplexer 310 selects one of the outputs from the delay line 260 as determined by the phase command word CMDPH<0:3> signal so that the optimum clock signal between Eo and E15 (FIG. 6) will be used as the internal clock ICLK.

In summary, the "inner" delay locked loop formed by the phase detector 272 and the voltage controlled delay circuit 260 generates a sequence of signals that have increasing phases from zero to 180 degrees. The "outer" delay locked loop formed by the phase detector 254, the voltage controlled delay circuit 252 and the delay line 260 align one of the clock signals in the sequence to the command clock. As a result, all of the clock signals at the output of the delay line 260 have respective predetermined phases relative to the phase of the command clock at node A.

Although the embodiment of the clock generator 210 illustrated in FIG. 5 uses delay-locked loops, it will be understood that other locked loop circuits, as well as circuits not using a locked loop, may be used in the clock control circuit 210.

Basically, the phase control circuit 314 determines the optimum phase command CMDPH<0:3> after two operating modes have been completed, namely a load mode and an analysis mode. In the load mode, the phase control circuit 314 sequentially increments the phase command CMDPH<0:3> to sequentially couple each tap of the delay line 310 (FIG. 5) to the ICLK driver 312 while the command decoder 200 repetitively receives initialization packets. Thus, the command decoder 200 attempts to accurately capture each initialization packet in the shift register 202 (FIG. 4) responsive to respective internal clock signals ICLK that sequentially vary in their timing relationship to the initialization packets. During the load mode, the phase control circuit 314 determines which initialization packets were successfully captured in the shift register 202. A record is then made identifying which phase commands CMDPH<0:3> (ie. which taps of the delay line 260) caused ICLK to clock the shift register 202 at the proper time to successfully capture these initialization packets.

In the analysis mode, the phase command in the command record are evaluated. More specifically, a single phase command CMDPH<0:3> that is most likely to be able to successfully capture packet words in a command packet is selected from the phase commands that successfully captured an initialization packet. This selected phase command CMDPH<0:3> is the command that is used to generate the ICLK signal during normal operation. A block diagram of the phase control circuit 314 for generating the phase command CMDPH<0:3> is illustrated in FIGS. 7A and 7B.

Figure 7A:
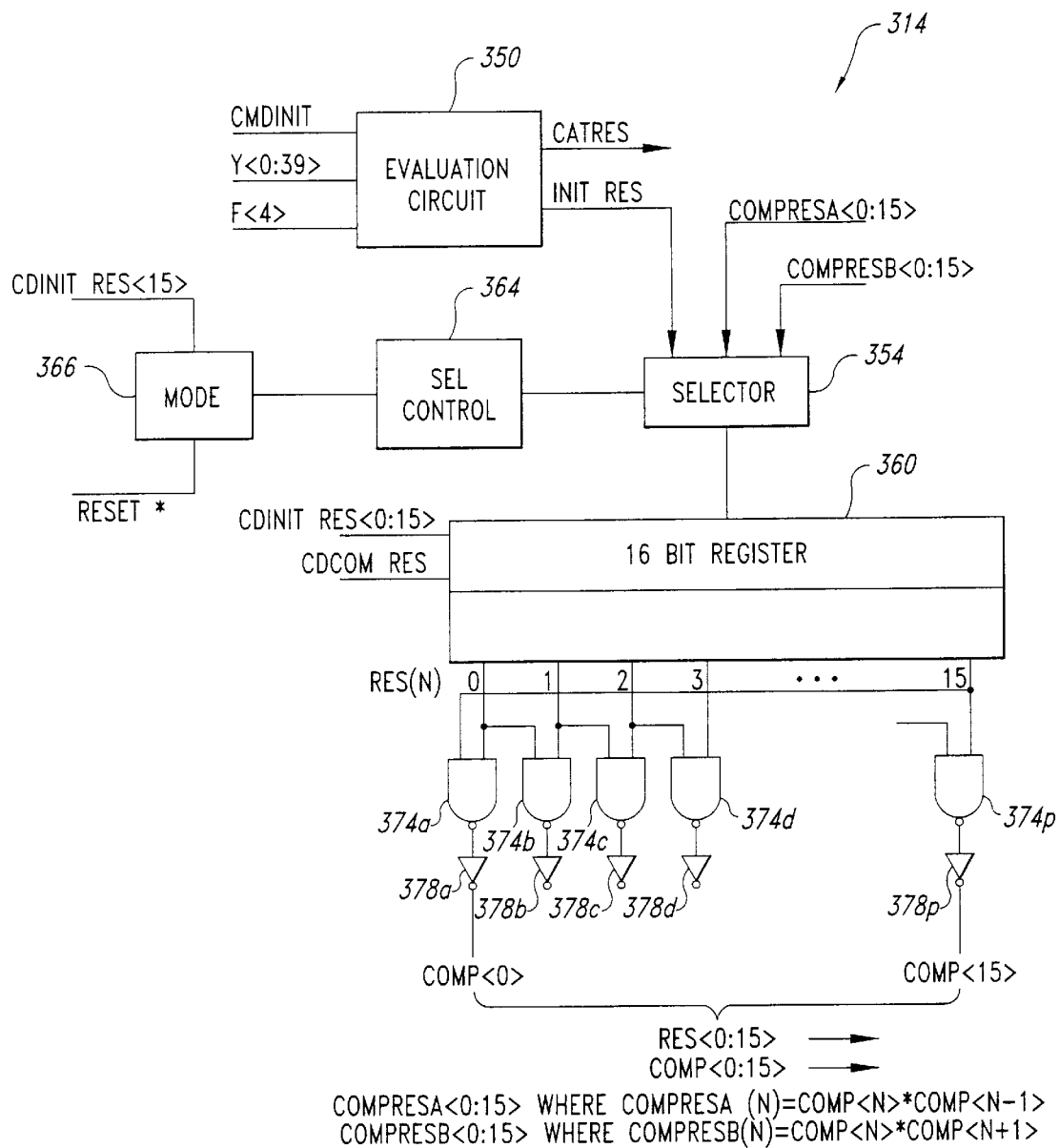
FIGS. 7A and 7B are a block diagram of one embodiment of a phase control circuit used in the clock control circuit of FIG. 5.
Figure 7B:
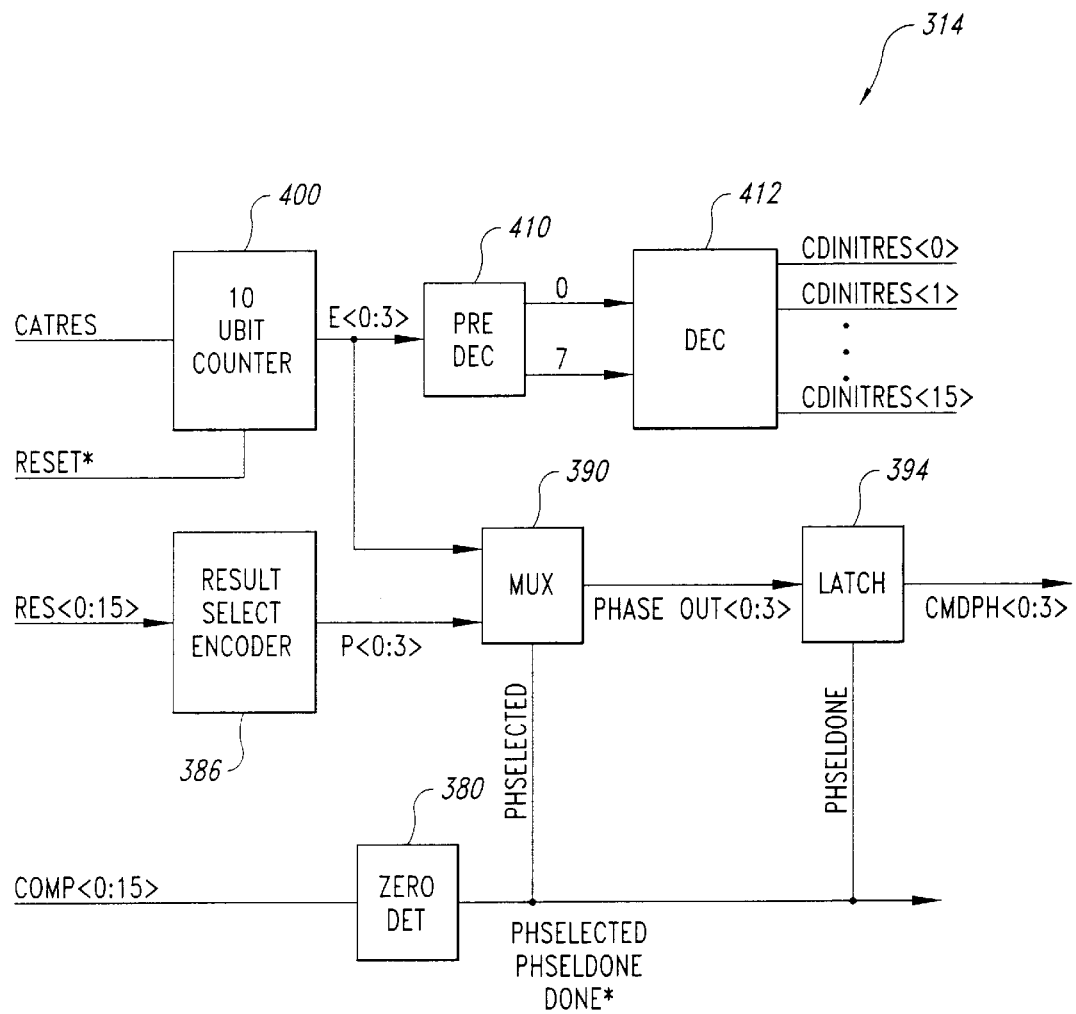

With reference to FIG. 7A, an evaluation circuit 350 receives an initialization word Y<0:39>, an F<4> signal, and an initialization command CMDINIT. The F<4> signal is generated by the shift register (FIG. 4) in the clock circuit 220 one-half clock period after four initialization packet words, ie., the entire initialization packet, have been latched into the shift register 202 and transferred to the storage register 208. The initialization word Y<0:39> is generated at the output of the storage register 208 and corresponds to the 4 packet words in each initialization packet. The initialization command CMDINIT is generated by other circuitry (not shown) in the command decoder 200 during the initialization procedure.

In operation, when the initialization command CMDINIT is active high, the evaluation circuit 350 analyzes the initialization word Y<0:39> to determine if the initialization packet has been accurately captured by the shift register 202

Figure 1:
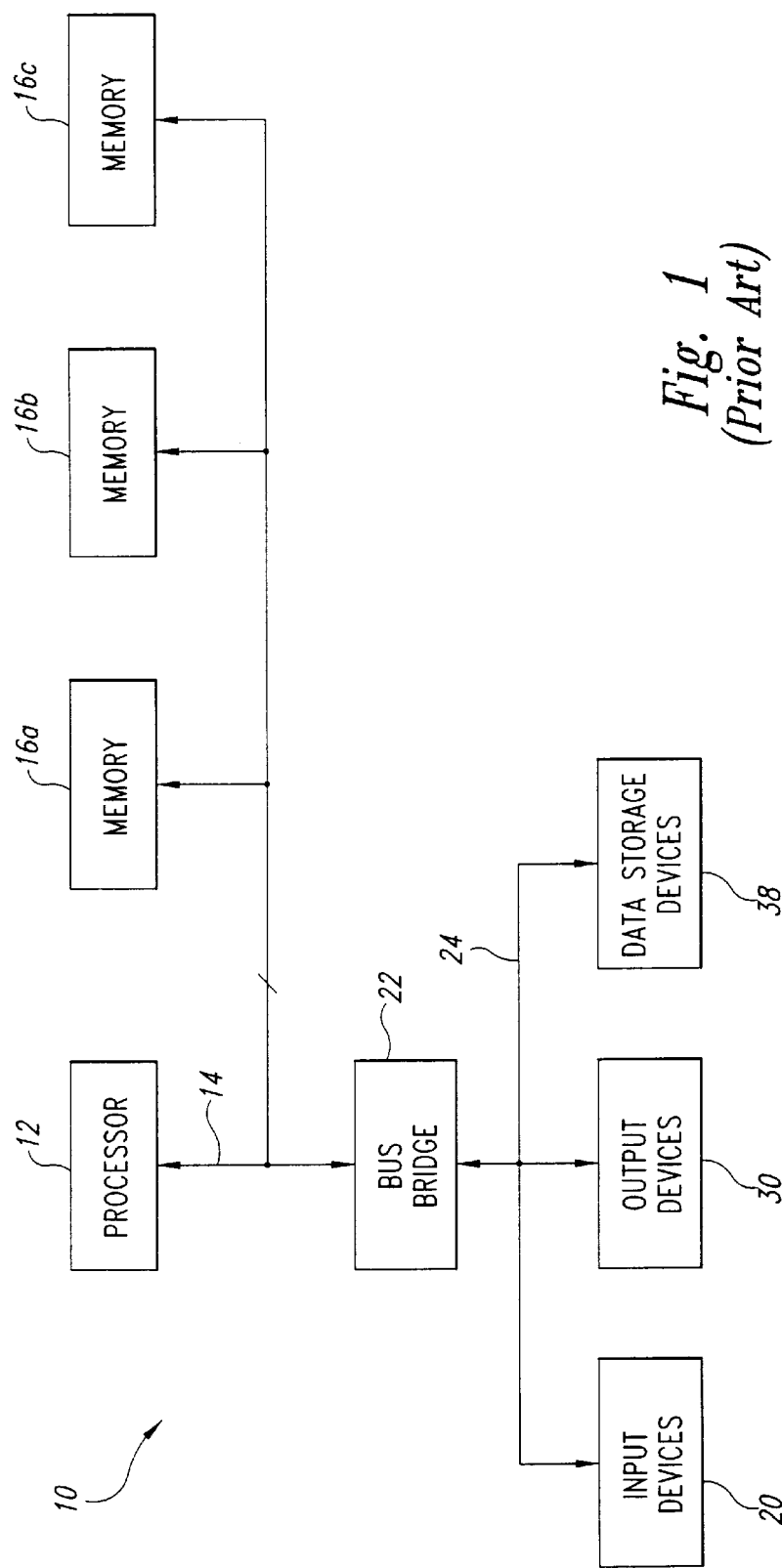
FIG. 1 is a block diagram of a conventional computer system using a plurality of SyncLink packetized memory devices.

(FIG. 4). If the captured initialization word Y<0:39> matches the initialization packet, the evaluation circuit 350 outputs an active high initialization result signal INITRES. The evaluation circuit also outputs a latch result signal LATRES responsive to each F<4> pulse as long as CMDINIT is high, regardless of the state of the initialization result signal INITRES. As mentioned above, in the load mode of the initialization procedure, the evaluation circuit 350 evaluates 16 initialization packets that are applied to the command decoder 200 at 16 respective time relationships to the internal clock signal ICLK. Thus, in the load mode, the evaluation circuit outputs 16 LATRES pulses and between 0 and 16 INITRES signals depending on the number of initialization packets successfully captured by the shift register 202.

Where multiple memory devices using the phase control circuit 314 are in a computer system, e.g., the computer system of FIG. 1, the evaluation circuit 350 may include means (not shown) for preventing more than one phase control circuit 314 from responding to the same initialization packets. For example, one memory device could be selected to be the first memory device to be initialized. After being initialized, the first memory device and all subsequent memory devices would enable initialization of the next memory device. Alternatively, the clock control circuits 210 of all of the memory devices in the computer system could be initialized at the same time responsive to the same 16 initialization packets.

With further reference to FIG. 7A, the initialization result INITRES from each of 16 evaluations is applied to a selector circuit 354 along with two compressed result words, COMPRESA<0:15> and COMPRESB<0:15>. The selector circuit 354 couples one of these three signals to a 16-bit register 360 responsive to signals from a selector control circuit 364. The selector control circuit 354 is, in turn, controlled by a mode circuit 366. The mode circuit receives an active low RESET* signal to place the phase control circuit 314 in the load mode, and an active high LDINITRES<15> (load initial response) signal to transition the phase control circuit 314 to the analysis mode.

In the load mode, the mode circuit 366 controls the selector control circuit 364 so that it causes the selector circuit 354 to couple the INITRES signal from the evaluation circuit 350 to the 16-bit register 360. Also, during the load mode, the bit location at which the INITRES signal is stored is controlled by a respective LDNITRES<0:15> signal. Thus, for example, when the INITRES signal (which indicates whether the initialization packet was successfully captured) obtained for a first phase of ICLK corresponding to the first tap of the delay line 260 is applied to the register 360, a LDINITRES<0> signal causes the INITRES signal to be stored in the first bit location of the register 360. Similarly, the INITRES signal obtained for a second phase of ICLK corresponding to the second tap of the delay line 260 is stored in the second bit location of the register 360 responsive to a LDINITRES<1> signal, etc. Finally, the INITRES signal obtained for the 16$^{th}$ phase of ICLK corresponding to the last tap of the delay line 260 is stored in the last bit location of the register 360 responsive to a LDINITRES<15> signal. At this time, the register 360 stores 16 bits of information indicative of which of the 16 phases of the ICLK signal corresponding to the 16 taps of the delay line 260 were successful in capturing the 16 initialization packets coupled to the command decoder 200 in the load mode. The stored information is output from the register 360 as RES<0:15>. As mentioned above, the LDINITRES<15> signal then switches the mode circuit 366 to the analysis mode since all of the information indicative of the capture of the initialization packets has then been loaded into the register 360.

By way of example, the register 360 may output "0000110011111000" as RES<0:15> after the completion of the load mode. The logic "1" values of RES<3–7, 10, and 11> thus indicates that the ICLK signal coupled from the 4th–8th, 11$^{th}$, and 12$^{th}$ taps of the delay line 260 were successful in capturing initialization packets.

When the LDINITRES<15> signal switches the mode circuit 366 to the analysis mode, the mode circuit 366 controls the selector control circuit 364 so that it causes the selector circuit 354 to alternately apply COMPRESA<0:15> and COMPRESB<0:15> to the 16-bit register 360. The 16 outputs of the register 360 are coupled to 16 NAND gates 374a–p which are, in turn coupled to respective inverters 378a–p so that the NAND gates 374 and inverters 378 together perform AND functions. The inputs of each NAND gate 374 receive a respective bit of the register 360 and an adjacent bit of the register 360, except for the first NAND gate 374a, which receives the output from bit 16 of the register 360. The outputs of the inverters are designated as COMP<0:15>, where COMP<N>=RES(N)*RES(N−1) (except for COMP<0> which is equal to RES<15>*RES<0>). The COMP<N> signals are fed back to a respective input of the register 360. However, the outputs of the inverters 378 are fed back differently for the COMPRESA<0:15> signals and the COMPRESB<0:15> signals. For COMPRESA<0:15>, each COMPRESA<N> is equal to COMP<N>*COMP<N−1>. For COMPRESB<0:15>, each COMPRESB<N> is equal to COMP<N>*COMP<N+1>. Further, in the analysis mode, the register 360 is controlled by the LDCOMPRES signal so that the 16 bits fed back to the register 360 are loaded into the register 360 in parallel.

The operation of the selector circuit 354, register 360, NAND gates 374 and inverters 378 in the analysis mode is best understood using the above example of "0000110011111000" for the initial RES<0:15>. After these values for RES<0:15> are coupled through the NAND gates 374 and inverters 378, COMP<0:15> is "0000010001111000". It can be seen by comparing RES<0:15> to COMP<0:15> that COMP<0:15> is the same as RES<0:15> except that every "1" that is to the right of a "0" has been converted to a "0". Thus, when the COMP<0:15> signals are fed back to the register 360 as COMPRESA<0:15>, the each "1" that is positioned to the right of a "0" is changed to a "0". As a result, the new values of RES<0:15> are the previous values for COMPRESA<0:15>, i.e., "0000010001111000". After these values for RES<0:15> are coupled through the NAND gates 374 and inverters 378, COMP<0:15> becomes "0000000000111000". However, since COMPRESB<N>= COMP<N>*COMP<N+1>, COMP<0:15> is coupled back to the register 360 as "0000000001110000". Thus, when the COMP<0:15> signals are fed back to the register 360 as COMPRESB<0:15>, each "1" that is positioned to the left of a "0" is changed to a "0". After RES<0:15> is coupled back to the register once more as COMPRESA<0:15>, the new RES<0:15> is "0000000000110000", i.e., the "1" to the right of a "0" is changed to a "0". Finally, when this last RES<0:15> is coupled back to the register once more as COMPRESB<0:15>, the new RES<0:15> is "0000000000100000", i.e., the "1" to the left of a "0" is changed to a "0". When this final RES<0:15> is coupled through the NAND gates 374 and the inverters 378, the new COMP<0:15> is "0000000000000000".

With reference to FIG. 7B, a COMP<0:15> of all "0"s is detected by a zero detector circuit 380, which then generates a phase selected signal PHSELECTED, a phase selected done signal PHSELDONE, and a DONE signal, each of which signifies that the optimum phase of the internal clock signal ICLK has been determined. At this time, a result select encoder 386 determines from the final RES<0:15> of "0000000000100000" that the $6^{th}$ bit of the register, i.e., RES<5> is the location in the register 360 that contains a "1". The result select encoder 386 then outputs a corresponding binary value P<0:3> of "0101". The result select encoder 386 also arbitrates between a result in which two or more "1"s are in the final RES<0:15>. For example, an initial RES<0:15> of "0111001110011100" would produce a final RES<0:15> of "0010000100001000" thereby providing an indication that three phases of ICLK are equally likely of capturing a command packet. The result select encoder 386 selects the lowest order "1" as the final result so that a final RES<0:15> of "0010000100001000" would be interpreted as "0000000000001000".

As mentioned above, when the final RES<0:15> is obtained, the zero detector circuit 380 outputs PHSELECTED, PHSELDONE, and DONE signals. The PHSELECTED signal causes a multiplexer to couple the P<0:3> word from the result select encoder 386 to a PHASEOUT<0:3> word that is stored in a latch 394 responsive to the PHSELDONE signal. The latch 394 then outputs the P<0:3> word corresponding to the final RES<0:15> as the phase command CMDPH<0:3>. As explained above, the phase command CMDPH<0:3> is used by the multiplexer 310 (FIG. 5) to select one of the taps of the delay line 260 to generate the internal clock signal ICLK. In the example given above where P<0:3> is "0101", the multiplexer 310 would select the sixth tap of the delay line 260 to generate ICLK.

The multiplexer 390 and latch 394 are also used in the load mode to cause the multiplexer 310 to sequentially select each of the taps of the delay line 260. Since PHSELECTED is inactive low prior to the end of the analyze mode, the multiplexer 390 couples the E<0:3> word from a 4-bit counter 400 to the input of the Latch 394. The inactive low PHSELDONE signal generated prior to the end of the analyzer mode causes the latch 394 to couple PHASEOUT <0:3> (corresponding to E<0:3>) through the latch 394 as CMDPH<0:3>. The CMDPH<0:3> word determines which tap of the delay line 260 is selected to generate ICLK.

The 4-bit counter 404 is enabled by an active low RESET* signal which, as explained above, occurs in the load mode. The counter 400 is incremented by each LATRES pulse which, as explained above, is generated by the evaluation circuit 350 (FIG. 7A) each time an initialization packet is received. Thus, as each initialization packet is received in the load mode, the counter 400 is incremented by one. The count of the counter 400 is coupled through the multiplexer 390 to the latch 394. The CMDPH<0:3> signals at the output of the latch 394 then sequentially selects each tap of the delay line 260 as the counter 400 is incremented. The count of the counter 400, i.e., E<0:3> is also applied to a predecoder 410 and decoder 412 to generate corresponding load initial results signals LDINITRES<0:15>. As explained above, the LDINITRES<0:15> signals are used by the register 360 to determine the bit of the register 360 in which an INITRES signal from the evaluation circuit 350 is stored. Thus, the counter output E<0:3> is initially "0000" to cause the LDINITERS<0> signal to be "1" and the LDINI-TRES<1:15> signals to be "0", thereby causing the evaluation result INITRES from receipt of the first initialization packet to be stored as bit zero in the register 360. As the same time, the counter output E<0:3> of "0000" is coupled through the multiplexer 390 and the latch 394 so that the phase command CMDPH<0:3> is "0000". The "0000" value of CMDPH<0:3> causes the multiplexer 310 to select the first tap of the delay line 260 to generate ICLK. After the counter 400 has been incremented to 15, i.e., "1111", CMDPH<0:3> also becomes "1111" thereby causing the multiplexer 310 to select the last tap of the delay line 260 to generate ICLK. At the same time the "1111" value of E<0:3> causes the decoder 412 to output an active high LDINI-TRES<15> to cause the INITRES from the evaluation circuit to be stored in bit 15 of the register 360. As mentioned above, the active high LDINITRES<15> also causes the mode circuit 366 (FIG. 7A) to transition to the analyze mode, since the initial results obtained in the load mode have now been loaded into the register. The phase control circuit 314 shown in FIGS. 7A and 7B thus adapts itself to use the ICLK phase that is most likely to be successful in capturing a command packet in normal operation.

Figure 8:
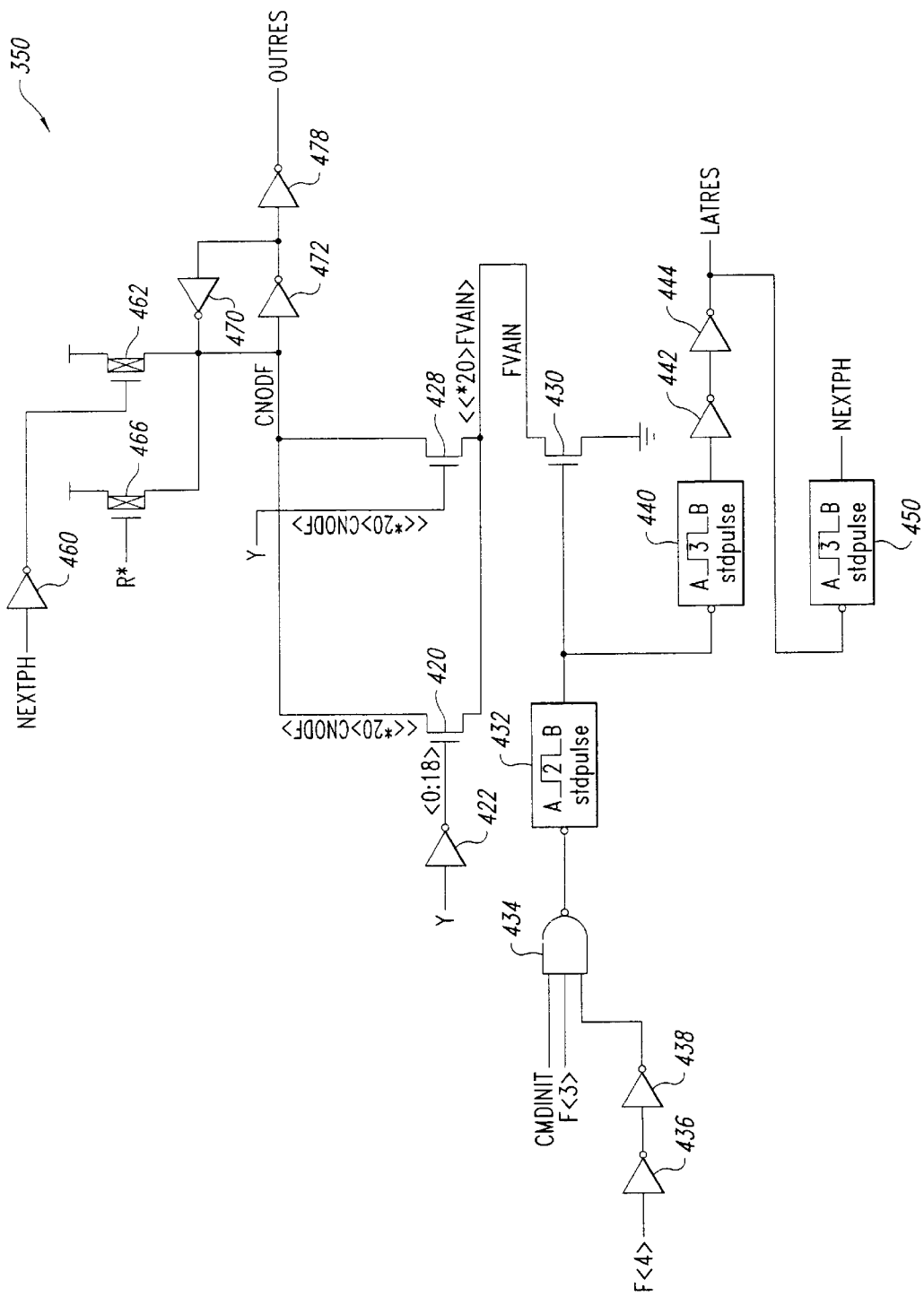
FIG. 8 is a logic diagram and schematic of an evaluation circuit used in the phase control circuit of FIGS. 7A and 7B.

The circuitry used in the block diagram of FIGS. 7A and 7B is shown in greater detail in FIGS. 8–16. With reference to FIG. 8, the evaluation circuit 350 is specifically adapted to detect a predetermined initialization packet. In the embodiment of FIG. 8, the initialization packet that the evaluation circuit 350 is adapted to detect is shown in Table 1, below.

TABLE 1

|     | Flag | CA0 | CA1 | CA2 | CA3 | CA4 | CA5 | CA6 | CA7 | CA8 | CA9 |
| --- | --- | --- | --- | --- | --- | --- | --- | --- | --- | --- | --- |
| PW1 | 1 | 1 | 0 | 1 | 0 | 1 | 0 | 1 | 0 | 1 | 0 |
| PW2 | 1 | 0 | 1 | 0 | 1 | 0 | 1 | 0 | 1 | 0 | 1 |
| PW3 | 0 | 1 | 0 | 1 | 0 | 1 | 0 | 1 | 0 | 1 | 0 |
| PW4 | 0 | 0 | 1 | 0 | 1 | 0 | 1 | 0 | 1 | 0 | 1 |

The initialization packet thus consists of four packet words, PW1–PW4, arranged in a checkerboard pattern, with the first two packet words, PW1 and PW2, having a flag bit. The initialization packet shown in Table 1, if successfully captured by the shift register 202 (FIG. 4), produces an initialization word Y<0:39> in which the initialization bits alternate between 0 and "1" from Y<0> to Y<39>. The initialization bits that should be a logic "1" are applied to the gate of a respective first NMOS transistor 420 through a respective inverter 422. Although only one NMOS transistor 420 and one inverter 422 is shown in FIG. 8, there are actually 20, i.e., one for each initialization bit that should be "1". The NMOS transistors 420 for all of the initialization bits are connected between CNODE and EVAL. Similarly, The initialization bits that should be a logic "0" are applied directly to the gate of a respective second NMOS transistor 428. Once again, although only one NMOS transistor 428 is shown in FIG. 8, there are actually 20, i.e., one for each initialization bit that should be "0". The NMOS transistors 428 for all of the initialization bits are also connected between CNODE and EVAL.

After each initialization word Y<0:39> has been captured, the EVAL node is pulled to ground by turning ON an NMOS transistor 430. The transistor 430 is turned ON by a pulse from a pulse generator 432 which is, in turn, triggered by a falling edge from a NAND gate 434. As mentioned above with reference to FIG. 7A, the CMDINT signal is active high during initialization, thereby enabling the NAND gate 434. However, the NAND gate 434 initially outputs a high because the F<3> signal from the clock circuit 220 (FIG. 4) and F<4> coupled through a pair of inverters 436, 438 are initially low. Further, since there is generally a FLAG signal sent with only the first packet word of a command packet, F<3> and F<4> are generally never high at the same time. However, as shown in Table 1, a FLAG signal is sent with the first two initialization words of each initialization packet. Thus, for initialization packets, F<3> and F<4>, even after being delayed through the inverters 436, 438, are both high for a short time after the initialization word has been stored in the storage register 208 (FIG. 4). At this time, the output of the NAND gate 434 goes low, thereby triggering the pulse generator 432 to turn ON the transistor 430 and pull the EVAL node low.

The pulse from the pulse generator 432 during each initialization packet also triggers a pulse generator 440 which generates the latch results pulse LATRES through a pair of inverters 442, 444. As explained above with reference to FIG. 7B, each LATRES pulse clocks the counter 400 in the load mode to specify the register bit in which an initial results signal INITRES is to be stored and to specify to the multiplexer 310 (FIG. 5) which tap of the delay line 260 should be selected. Each LATRES pulse, in turn, triggers another pulse generator 450 which generates a NEXTPH pulse.

The NEXTPH pulse is coupled through an inverter 460 to the gate of a PMOS transistor 462 to turn ON the transistor 462 and pull CNODE high. The high on CNODE is then latched by a latch, formed by a pair of inverters 470, 472, which maintains CNODE high. CNODE can also be pulled high by a PMOS transistor 466 responsive to a reset signal R*.

After CNODE has been latched high, it will be pulled low if either of the NMOS transistors 420, 238 turns ON. However, if the initialization packet is successfully captured by the shift register 202 (FIG. 4), neither of the NMOS transistors 420, 428 will turn on so that CNODE will be maintained high. As a result, the latch formed by the inverters 470, 472, generates an active high initial results signal INITRES. Thus, INITRES will be high if the initialization packet was successfully captured by the shift register 202 (FIG. 4), and low if there is an error in any of the initialization bits as captured by the shift register 202.

As explained above with reference to FIG. 7A, the INITRES signal is stored in the 16 bit register 360. The register 360, as well as the selector circuit 354, is shown in greater detail in FIG. 9. The selector circuit 354 and register 360 includes 16 separate selectors 354a–p and 16 separate register circuits 360a–p, only one of which 354a and 360a is shown in detail in FIG. 9.

Figure 9:
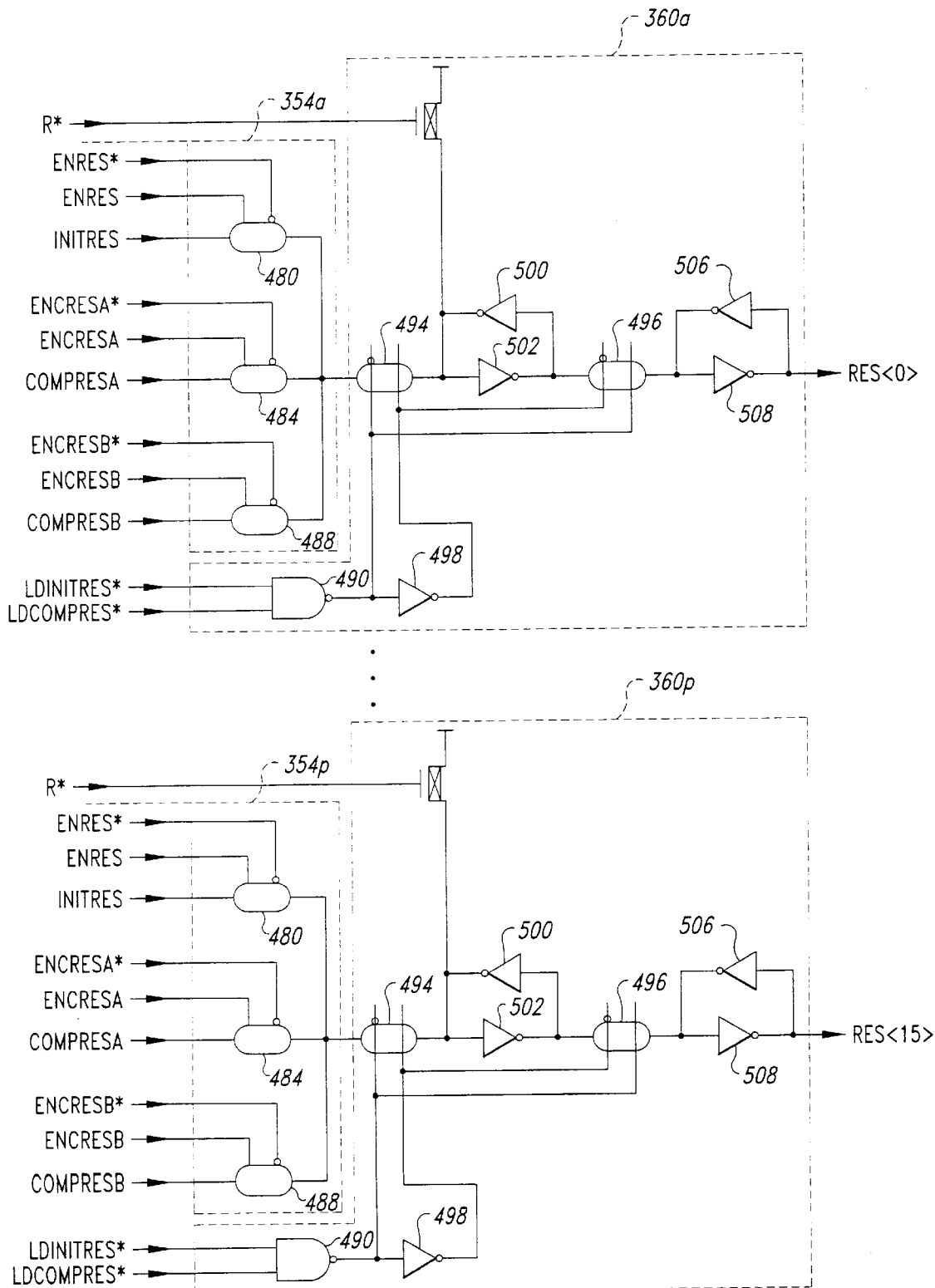
FIG. 9 is a logic diagram and schematic of a register and a signal selector used in the phase control circuit of FIGS. 7A and 7B.

A separate register circuit 360 is provided to store each of the 16 INITRES signals, and a separate selector 354 is provided to couple each INITRES signal to its respective register circuit 360. With reference to FIG. 9, in the load mode, an active high ENRES signal and an active low ENRES* signal enable a pass gate 480 in the selector 354 to coupled the INITRES signal to the input of the register 360. During this time, the ENCRESA and ENCRESB signals are inactive low and the ENCRESA* and ENCRESB* signals are inactive high to disable respective pass gates 484, 488. As also explained above with reference to FIG. 7A, a plurality of load initial results signals LDINITRES*<0:15> are provided for the respective register bits, and the LDINITRES* signal for each register bit is driven low after an INITRES signal corresponding to that bit is obtained. The active low LDINITRES* signal causes a NAND gate 490 in the corresponding register circuit 360 to output a high which disables a pass gate 494 and enables a pass gate 496, directly and through an inverter 498. The INITRES signal coupled through the pass gate 480 is then stored in a latch formed by a pair of inverters 500, 502, and the output of the latch is coupled through the pass gate 496 to a latch formed by a pair of inverters 506, 508. The RES<0:15> outputs from the register 360 are thus each "1" if the INITRES signal is indicative of the initialization packet being successfully captured is "1".

The operation of the register 360 and the selector circuit 354 in the analysis mode will now be explained. In the analysis mode, ENRES is inactive low and ENRES* is inactive high to disable the pass gate 480 and isolate the INITRES signal from the register 360. However, ENCRESA and ENCRESB are alternately active high and ENCRESA* and ENCRESB* are alternately active low so that the pass gates 484, 488 are alternately enabled. As a result, as explained above with reference to FIG. 7A, COMPRESA<0:15> and COMPRESB<0:15> are alternately coupled to their respective inputs of the register 360. As also explained above with reference to FIG. 7A, in the analyze mode, the LDCOMPRES* signal is driven low after each compression iteration. The active low LDCOMPRES* signal triggers the latch to store either COMPRESA or COMPRESB in the register 360 in the same manner that LDINITRES* causes the INITRES signal to be stored in the register 360, as explained above.

Figure 10:
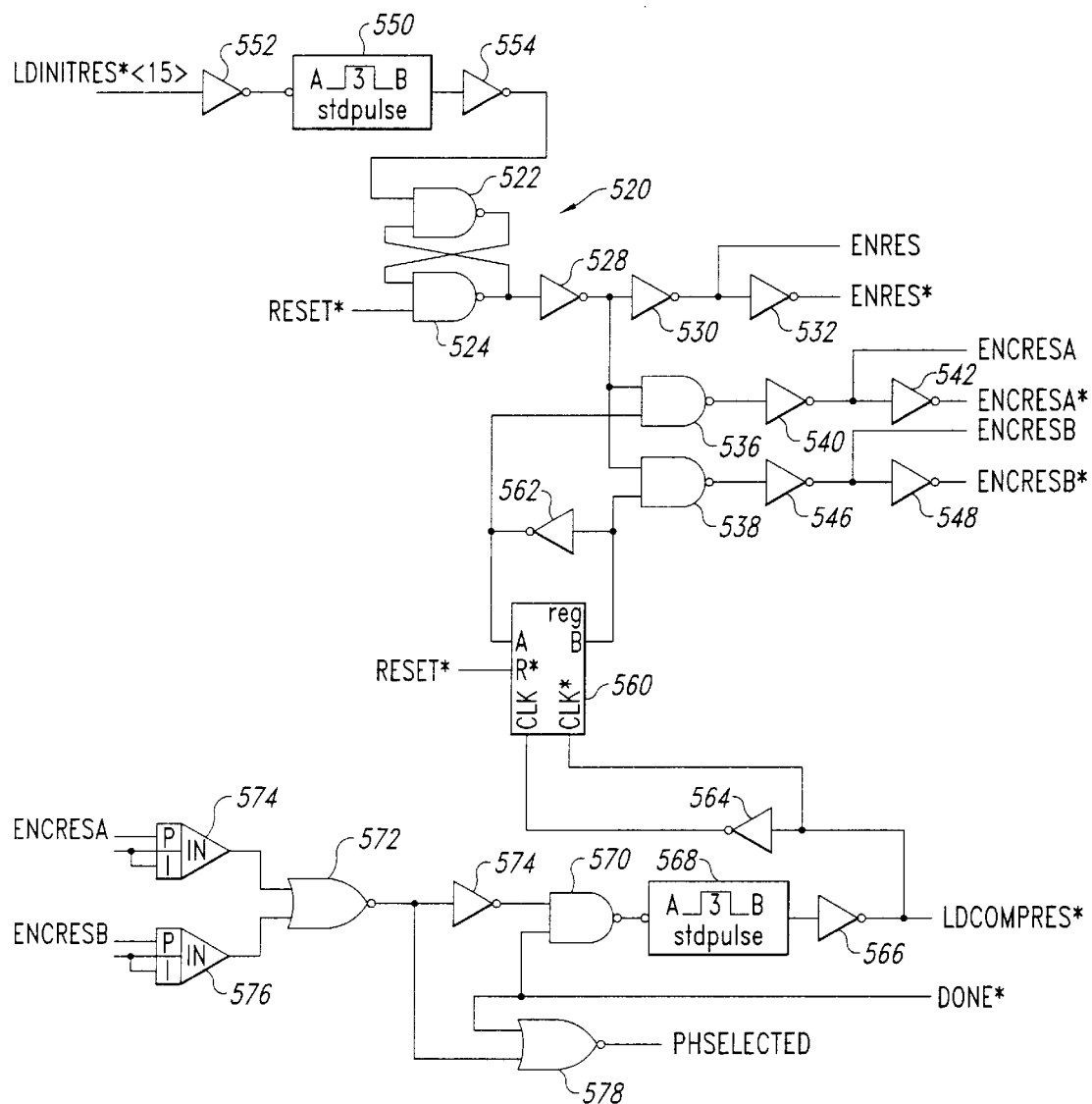
FIG. 10 is a logic diagram of a mode circuit and selector control circuit used in the phase control circuit of FIGS. 7A and 7B.
Figure 11:
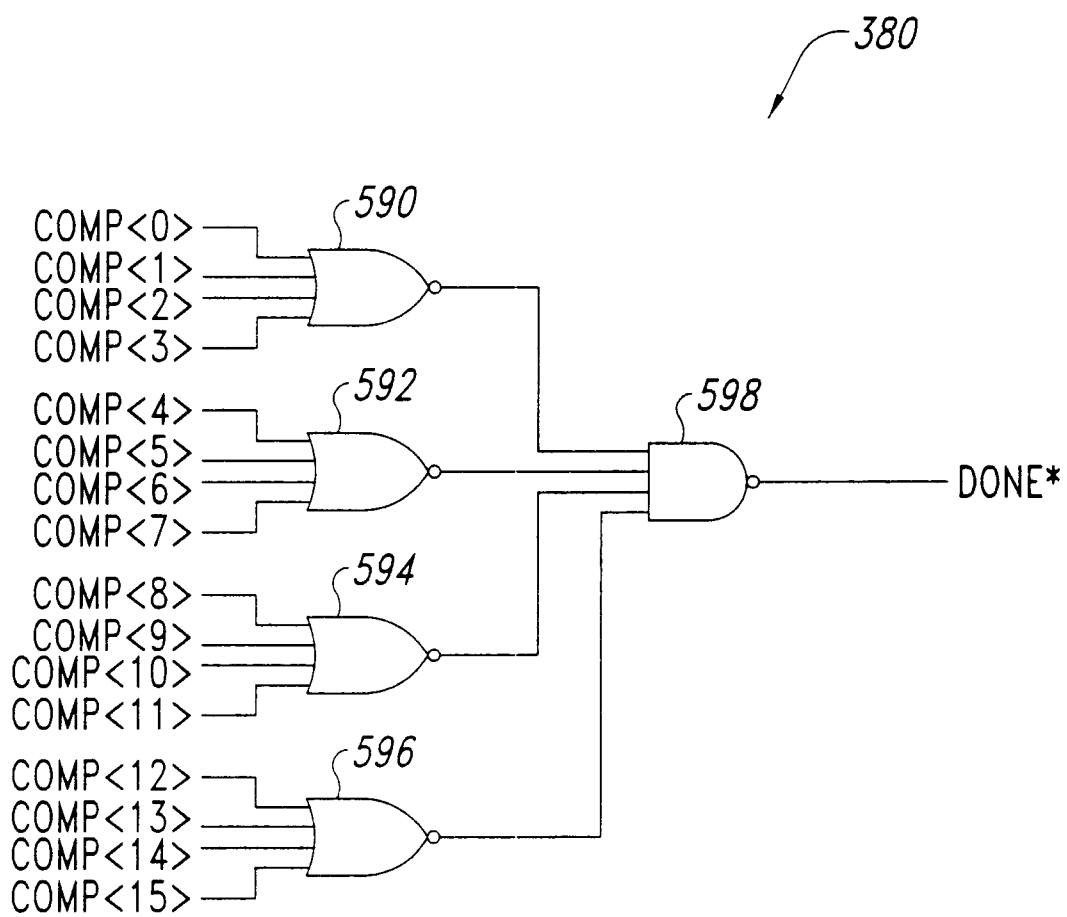
FIG. 11 is a logic diagram of a zero detector circuit used in the phase control circuit of FIGS. 7A and 7B.

The mode circuit 366 and the selector control circuit 354 are illustrated in FIG. 10. A flip-flop 520 formed by a pair of NAND gates 522, 524 is initially reset by an active low RESET* signal generated by means (not shown) located elsewhere in the command decoder 200. For example, the RESET* signal may be generated at power-up or periodically, as is well known in the art. When the flip-flop 520 is reset, it outputs a high which is coupled through inverters 528, 530, 532 to generate an active high ENRES signal and an active low ENRES* signal. As explained above, these signals place the phase control circuit 314 in the load mode by coupling the INITRES signal to the register 360.

The high at the output of the reset flip-flop 520 is coupled though the inverter 528 to cause a pair of NAND gates 536, 538 to output respective high signals. The high at the output of the NAND gate 536 is coupled though a pair of inverters 540, 542 to generate an inactive low ENRESA signal and an inactive high ENRESA* signal. Similarly, the high at the output of the NAND gate 538 is coupled though a pair of inverters 546, 548 to generate an inactive low ENRESB signal and an inactive high ENRESB* signal. As explained above with reference to FIGS. 7A and 8, these signal isolate the COMPRESA and COMPRESB signals from the register 360 in the load mode.

As explained above with reference to FIG. 7, the active low LDINITRES*<15> signal is generated to load the final initial results signal INITRES into the last bit of the register 360. The LDINITRES*<15> signal also triggers a pulse generator 550 through an inverter 552 to generate a pulse a short time after LDINITRES*<15> causes the final INI- TRES to be loaded in the register 360. This pulse is coupled through an inverter 554 to set the flip-flop 520, thereby placing the phase control circuit 314 in the analyze mode.

In the analyze mode, the high at the output of the inverter 528 drives ENRES inactive low and ENRES* inactive high. The high at the output of the inverter 528 also enables the NAND gates 536, 538. The NAND gate 538 receives the output of a register 560, while the NAND gate 536 receives its compliment from an inverter 562. The output of the inverter 562 is also applied to the input of the register 560. As a result, when the register 560 is successively clocked, the output of the register toggles between "0" and "1". When the output of the register 560 is "1", the NAND gate 538 causes ENCRESB to be active high and ENCRESB* to be active low. When the output of the register 560 is "0", the NAND gate 536 causes ENCRESA to be active high and ENCRESA* to be active low. Thus, as the register 560 is clocked, the COMP<0:15> signals (FIG. 7A) are fed back to the inputs of the register 360 alternately as COMPRESA<0:15> and COMPRESB<0:15>, as explained above with reference to FIG. 7A. The register 560 is clocked by the LDCOMPRES* signal, directly and through and inverter 564. The LDCOMPRES* signal is generated at the output of an inverter 566 responsive to a pulse from a pulse generator 568. The pulse generator 568 is, in turn, triggered by the output of a NAND gate 570. The NAND gate 570 is enabled by an inactive high DONE* signal which is present until the analysis mode had determined which tap of the delay line 260 (FIG. 5) is to be used to generate ICLK. The other input of the NAND gate 570 is coupled to the output of a NOR gate 572 through an inverter 574. The NOR gate 572 triggers the pulse generator 568 responsive to a pulse from either of two delay circuits 574, 576 which receive the ENCRESA and ENCRESB signals, respectively. The delay provided by the delay circuits 574, 576 allows sufficient time for ENCRESA, ENCRESB and their compliments to enable their respective pass gates 484, 488 (FIG. 9) to couple COMPRESA and COMPRESB to the latch formed by the inverters 500, 502 before the LDCOMPRES* is generated to store COMPRESA and COMPRESB in the latch. Thus, when ENCRESA is generated at the output of the inverter 540, it toggles the register 560 so that ENCRESB is generated after ENCRESA has loaded COMPRESA<0:15> into the register 360. ENCRESB then causes COMPRESB<0:15> to be loaded into the register 360 and toggles the register 560 to generate ENCRESA, etc. This process continues until all of the bits of COMP<0:15> are logic "0". At this time, the output of the register 360 RES<0:15> specifies the tap of the delay line 260 that will be used in normal operation, and the zero detector circuit 380 (FIG. 7B) outputs an active low DONE* signal. The active low DONE* signal applied to the input of a NOR gate 578 causes the PHSELECTED signal to go high. As explained above with reference to FIG. 7B, the PHSELECTED signal causes the multiplexer 390 to coupled the final RES<0:15> to the multiplexer 310 to select the delay line tap that will be used during normal operation of the memory device containing the command buffer and clock generator circuit 200.

The zero detector circuit 380 is implemented by four 4-input NOR gates 590–596 which drive a 4-input NAND gate 598, thereby creating a 16-input OR gate. When the RES<0:1> signals contain only single "1"s, i.e., there are no "1"s adjacent each other, the resulting COMP<0:15> signals will all be "0". If each group of 4 COMP<0:15> signals applied to a respective NOR gate 590–596 are all "0", then the outputs of the NOR gates 590 will all be high, thereby causing the NAND gate 598 to output an active low DONE* signal. As explained above, the active low DONE* signal indicates that the analysis mode has determined which tap of the delay line 260 is to be used to generate ICLK during normal operation.

Figure 12:
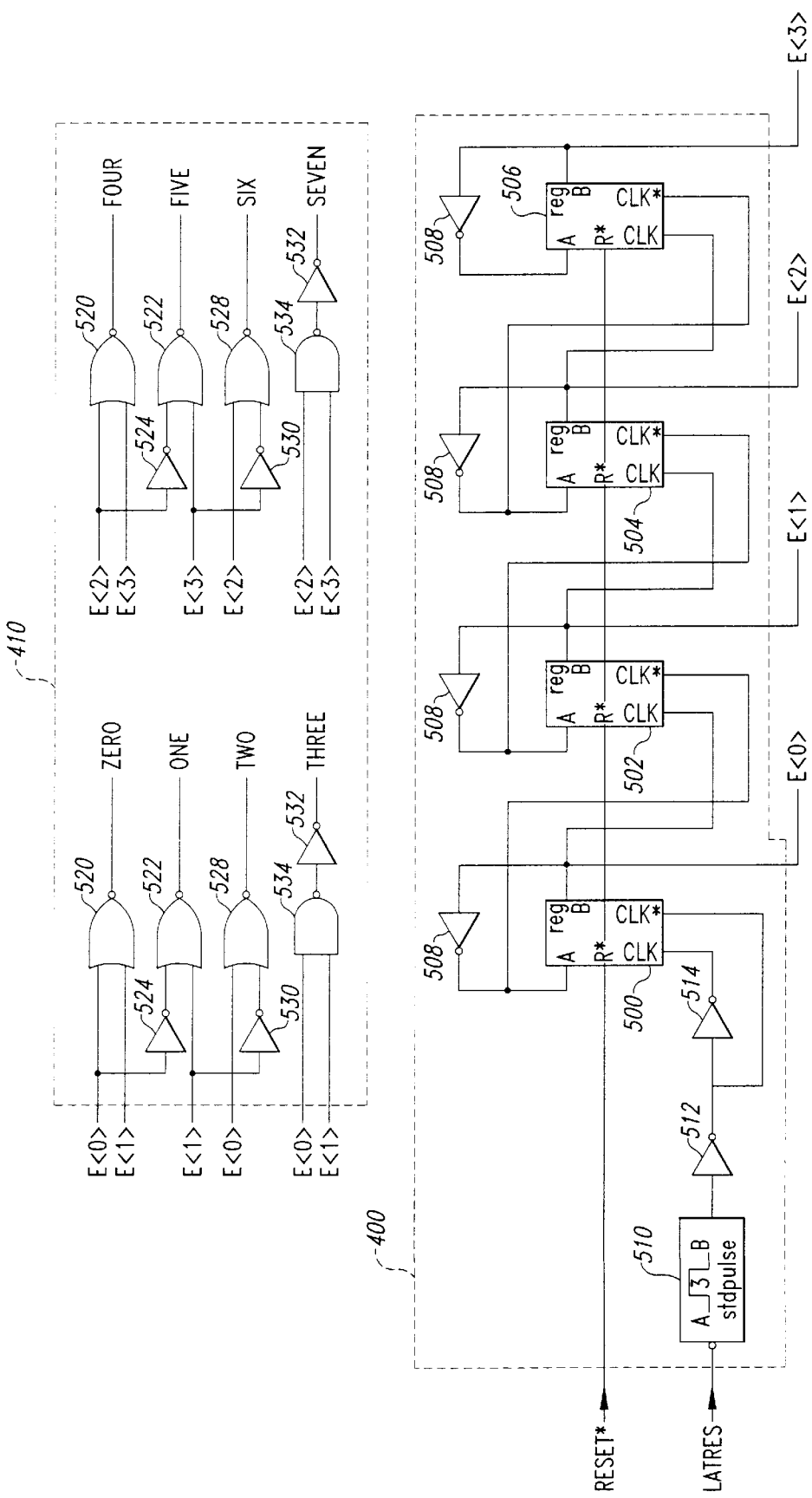
FIG. 12 is a logic diagram of a counter and a predecoder circuit used in the phase control circuit of FIGS. 7A and 7B.

The 4-bit counter 400 and predecoder 410 (FIG. 7B) are illustrated in greater detail in FIG. 12. As described above, the counter 400 is incremented by each LATRES pulse which is generated by the evaluation circuit 350 (FIG. 8) each time an initialization packet is received. Thus, as each initialization packet is received in the load mode, the counter 400 is incremented by one. As described above with reference to FIG. 7, the count of the counter 400 is coupled through the multiplexer 390 and latch 394 to sequentially select each tap of the delay line 260 as the counter 400 is incremented. The count of the counter 400, is also applied to the predecoder 410 and decoder 412 to generate a corresponding load initial results signals LDINITRES<0:15 which specifies the bit of the register 360 in which each INITRES signal from the evaluation circuit 350 is stored.

The counter 400 is implemented in a conventional manner by four registers 500–506 each of which has a RESET* input, an output fed back to its input by a respective inverter 508, and a pair of clock inputs CLK and CLK*. The first register 500 is clocked by a pulse generator 510 through a pair of inverters 512, 514 responsive to each latch result signal LATRES. Thus, the first register 500 toggles each LATRES pulse. It will be recalled that the LATRES signal is generated by the evaluation circuit 350 (FIG. 8) each time an initialization packet is received. The remaining registers 502–506 are clocked by the output of the prior register 500–506, respectively, so that their respective outputs toggle every other time the output of a prior register transitions from high to low. Thus, the value of the E<0:3> output signals from the counter 400 increment once for each LATRES pulse, i.e, each time an initialization packet has been received.

The output of the counter 400 is applied to the predecoder 410 which is also illustrated in FIG. 12. The predecoder 410 uses a NOR gate 522 to drive ZERO high only if E<0> or E<1> are both low. Thus, ZERO is high only if the count of the counter is 0, 4, 8, or 12. The ONE output is generated by a NOR gate 522 that receives the E<1> and the inverted E<0> signal coupled though an inverter 524. The output of the NOR gate 522 is high only if E<1> is low and E<0> is high. Thus, ONE is high only if the count of the counter is 1, 5, 9, or 13. The TWO output of a NOR gate 528 will be high only if E<0> is low and E<1> applied to the NOR gate 528 through an inverter 530 is high. Thus, TWO is high only if the count of the counter is 2, 6, 10, or 14. Finally, the THREE signal at the output of an inverter 532 will be high only if the E<0> and E<1> signals applied to the inputs of a NAND gate 534 are both high. Thus, THREE is high only if the count of the counter is 3, 7, 11, or 15.

The FOUR, FIVE, SIX and SEVEN signals are generated by decoding E<2> and E<3> using the same circuitry that is used to decode E<0> and E<1> to obtain the ZERO, ONE, TWO and THREE signals. Thus, in the interests of brevity, an explanation of decoding of E<2> and E<3> will be omitted. However, the outputs of the predecoder 410 are as specified in Table 2, below.

TABLE 2

| COUNT | SEVEN | SIX | FIVE | FOUR | THREE | TWO | ONE | ZERO |
|---|---|---|---|---|---|---|---|---|
| 0 | 0 | 0 | 0 | 1 | 0 | 0 | 0 | 1 |
| 1 | 0 | 0 | 0 | 1 | 0 | 0 | 1 | 0 |
| 2 | 0 | 0 | 0 | 1 | 0 | 1 | 0 | 0 |
| 3 | 0 | 0 | 0 | 1 | 1 | 0 | 0 | 0 |
| 4 | 0 | 0 | 1 | 0 | 0 | 0 | 0 | 1 |
| 5 | 0 | 0 | 1 | 0 | 0 | 0 | 1 | 0 |
| 6 | 0 | 0 | 1 | 0 | 0 | 1 | 0 | 0 |
| 7 | 0 | 0 | 1 | 0 | 1 | 0 | 0 | 0 |
| 8 | 0 | 1 | 0 | 0 | 0 | 0 | 0 | 1 |
| 9 | 0 | 1 | 0 | 0 | 0 | 0 | 1 | 0 |
| 10 | 0 | 1 | 0 | 0 | 0 | 1 | 0 | 0 |
| 11 | 0 | 1 | 0 | 0 | 1 | 0 | 0 | 0 |
| 12 | 1 | 0 | 0 | 0 | 0 | 0 | 0 | 1 |
| 13 | 1 | 0 | 0 | 0 | 0 | 0 | 1 | 0 |
| 14 | 1 | 0 | 0 | 0 | 0 | 1 | 0 | 0 |
| 15 | 1 | 0 | 0 | 0 | 1 | 0 | 0 | 0 |

Figure 13:
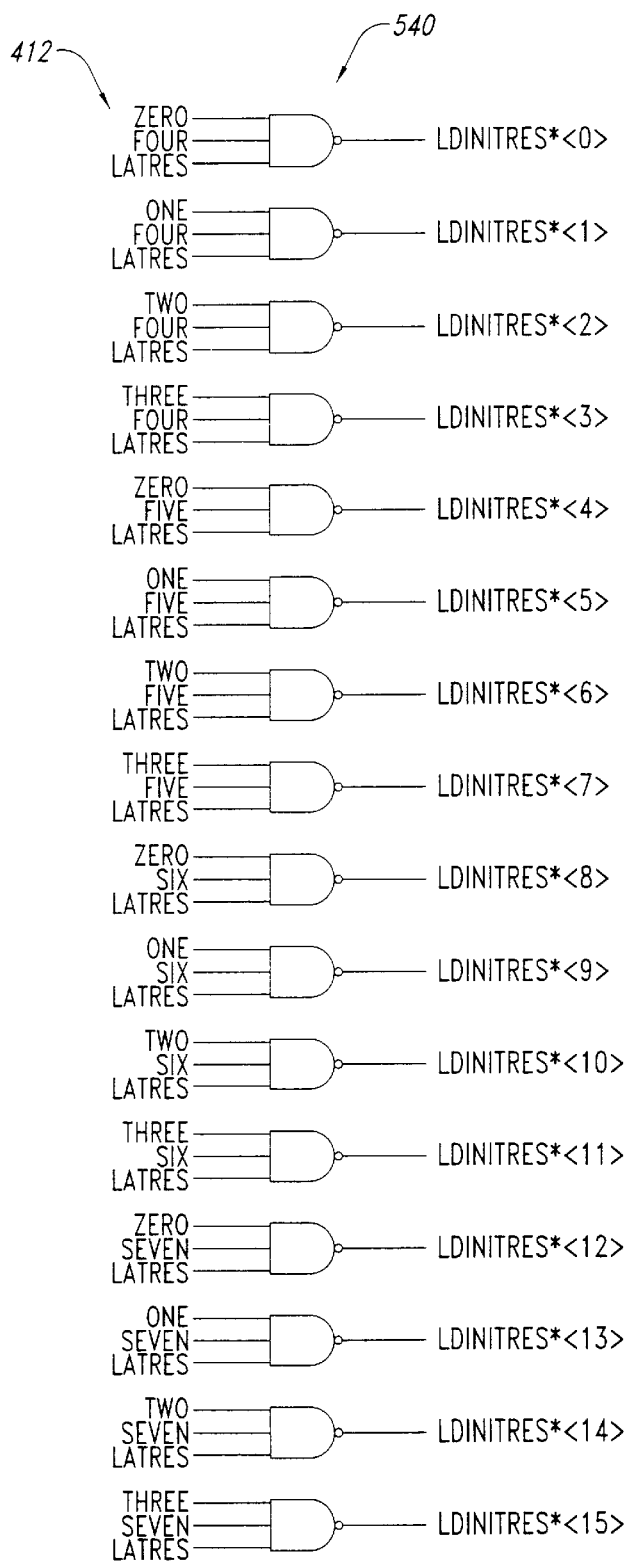
FIG. 13 is a logic diagram of a decoder circuit used in the phase control circuit of FIGS. 7A and 7B.

The output signals from the predecoder 410 are further decoded by the decoder 412 (FIG. 7) to generate each of the load initial result signals LDINITRES*<0:15>. As explained above with reference to FIG. 7B, each LDINITRES*<N> signal loads the initial result INITRES from the evaluation circuit 350 into the N bit of the register 360. As shown in FIG. 13, the decoder 412 includes 16 NAND gates, indicated collectively by reference numeral 540. Each of the NAND gates 540 receives a unique combination of two inputs from the predecoder 410, and all of the NAND gates 540 receive the LATRES signal. It will be recalled that the LATRES signal is generated by the evaluation circuit 350 (FIG. 8) each time an initialization packet is received. However, only one of the NAND gates 540 will output an active low LDINITRES* signal since only one NAND gate 540 will be enabled by both of its inputs from the predecoder 410 being high. The active low LDINITRES* signal then loads the INITRES signal in the bit of the register corresponding to the count designated by the outputs from the predecoder 410. The manner in which the NAND gates 540 to accomplish this function will be apparent to one skilled in the art from FIG. 13 and Table 2.

As explained above with reference to FIG. 7B, the function of the result select encoder 386 is to arbitrate between a situation in which two or more "1"s are in the final RES<0:15>. There will only be one "1" in the final RES<0:15> as long as there is only one set of "1"s in the initial RES<0:15> having the maximum length. However, if there are two or more sets in the initial RES<0:15> that have the same number of "1"s, then the final RES<0:15> will contain more than one "1". The result select encoder 386 selects the lowest "1" in the final RES<0:15> and forces the other "1"s to "0". The result select encoder 386 is shown in greater detail in FIG. 14.

Figure 14:
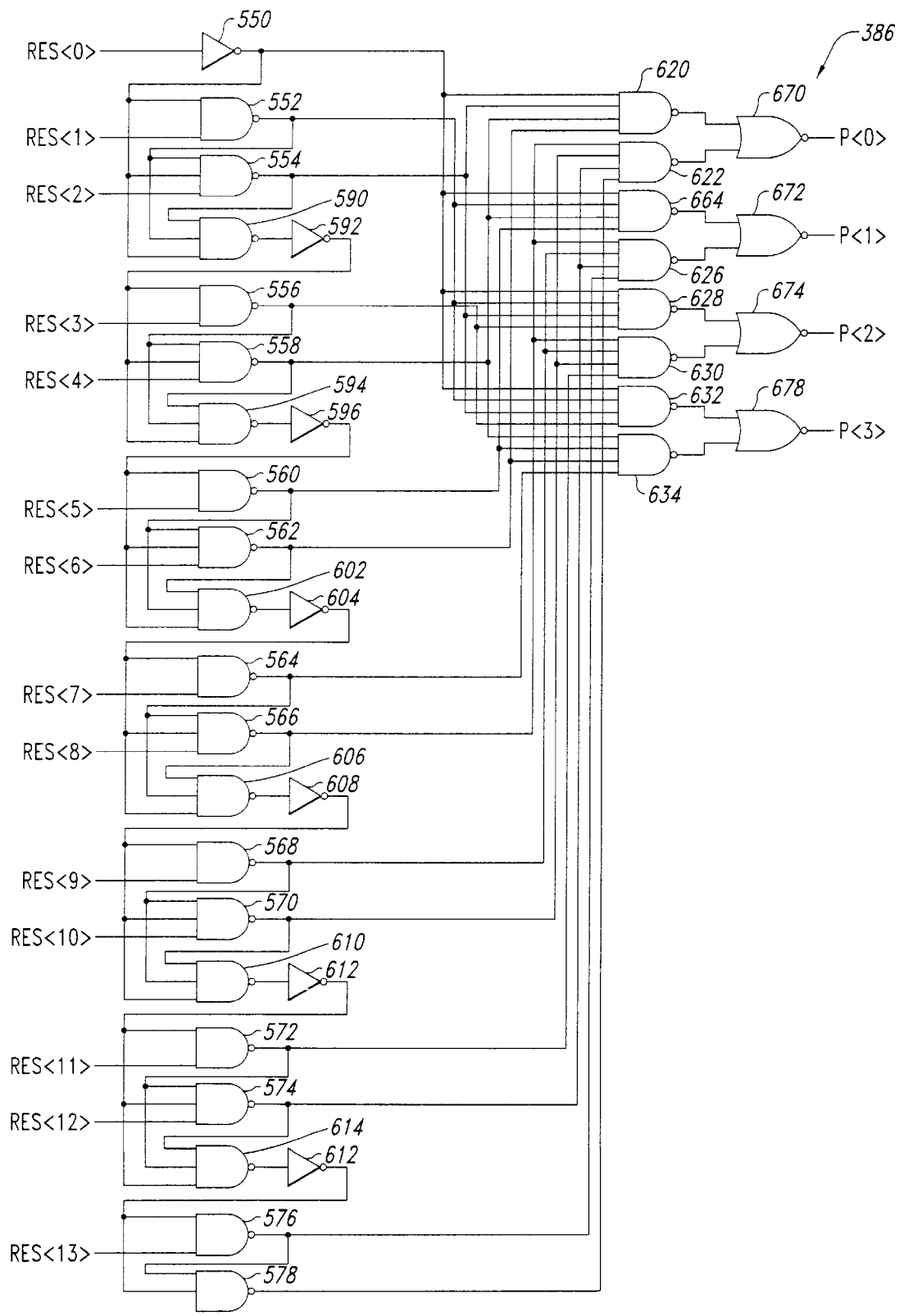
FIG. 14 is a logic diagram and schematic of a results selector encoder used in the phase control circuit of FIGS. 7A and 7B.

With reference to FIG. 14, the result select encoder 386 includes an inverter 550 and a set of NAND gates 552–578 that each receive a respective RES<0:14> bit and one or more signals from the output of the inverter 550 or NAND gates 552–578 receiving lower order RES bits. The inverter 550 outputs a low if RES<0> is high. However, the NAND gates 572–578 can output a low responsive to its respective RES input being high only if it is not disabled by one or more signals from the inverter 550 or NAND gates 552–578 receiving lower order RES bits. If the inverter 550 or any of the NAND gates 552–578 outputs a low, it disables all of the NAND gates 552–578 that receive higher order RES bits. Thus, for example, if RES<0> is "1", the low at the output of the inverter 550 disables the NAND gates 552, 554. The low at the output of the inverter 550 is also applied to a NAND gate 590 which causes a low to be generated at the output of an inverter 592. The inverter 592 will also output a low if the outputs of either NAND gate 552 or NAND gate 554 goes low responsive to a high RES<1> or RES<2>, respectively. The low at the output of the inverter 592 disables the NAND gates 556, 558, and it is also applied to a NAND gate 594 to cause an inverter 596 to output a low. The low at the output of the inverter 596, in turn, disables NAND gates 560, 562, and is applied to a NAND gate 602 to cause an inverter 604 to output a low. The low at the output of the inverter 604, in turn, disables NAND gates 564, 566, and is applied to a NAND gate 606 to cause an inverter 608 to output a low. The low at the output of the inverter 608 disables NAND gates 568, 570, and is applied to a NAND gate 610 to cause an inverter 612 to output a low. The low at the output of the inverter 612 disables NAND gates 572, 574, and is applied to a NAND gate 614 to cause an inverter 616 to output a low. Finally, the low at the output of the inverter 616 disables NAND gates 576, 578. Thus, only the output of the inverter 550 will be low, regardless of how many RES bits in addition to RES<0> are high.

The outputs of the inverter 550 and the NAND gates 552–578 are applied to a set of NAND gates 620–634 that, in turn, drive four NOR gates 670–678. The function of these NAND gates 620–632 and NOR gates 670–678 is to generate the a binary number P<0:3> corresponding to the compliment of whichever inverter 550 or NAND gate 552–578 is outputting a low. The inverter 550 or NAND gate 552–578, in turn, is indicative of the lowest order RES bit that is "1". Thus, for example, the NAND gates 620, 622 together decode RES<0,2,4,6,8,10,12,14>. The NAND gates 632, 634 together decode RES<8:15>.

Figure 15:
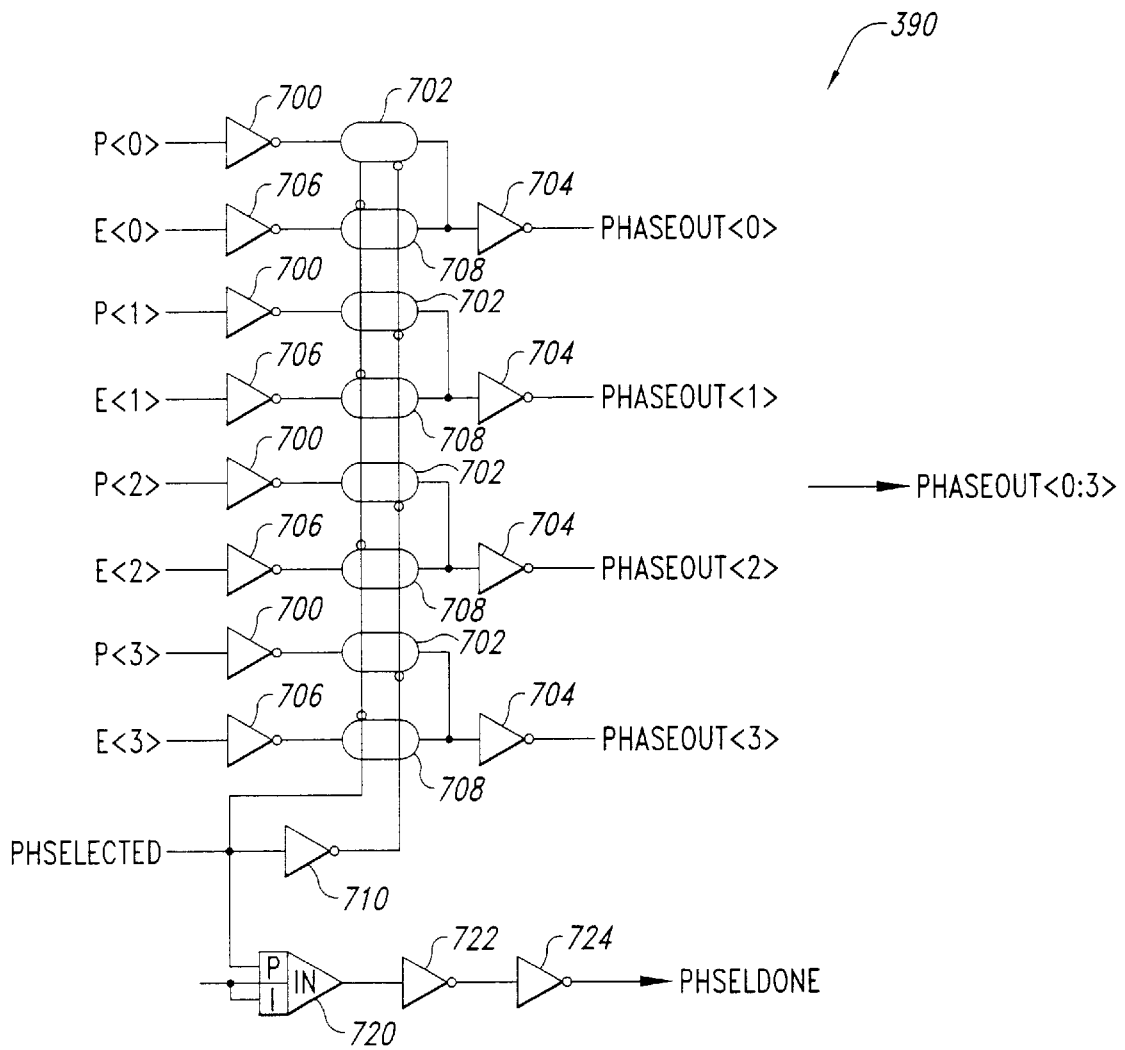
FIG. 15 is a logic diagram of a multiplexer circuit used in the phase control circuit of FIGS. 7A and 7B.

Either the P<0:3> or the E<0:3> signals from the counter 400 are coupled by the multiplexer 390 (FIG. 7B) to the latch 394. The multiplexer 390 is shown in FIG. 15. The P<0:3> signals are applied through respective inverters 700 to respective pass gates 702 which are coupled to the inputs of respective inverters 704. Similarly, The E<0:3> signals are applied through respective inverters 706 to respective pass gates 708 which are also coupled to the inverters 704. The pass gates 702 are enabled directly and through an inverter 710 by PHSELECTED being active high. When the pass gates 702 are enabled, the P<0:3> signals are coupled to the inverters 704. When PHSELECTED is inactive low, the pass gates 708 are enabled to couple the E<0:3> signal to the inverters 704. The inverters 704 thus output as PHASEOUT<0:3> either P<0:3> or E<0:3>, depending on the state of PHSELECTED. As explained above, PHSELECTED is low during the initialization procedure so that the E<0:3> signals from the counter 400 select the tap of the delay line 260 and select the bit of the register 360 in which each INITRES is stored. However, once the optimum delay line tap has been selected in the analysis mode, PHSELECTED goes high to select P<0:3> corresponding to the final RES<0:15> to designate the tap of the delay line 260.

The multiplexer 390 also includes a delay circuit 720 receiving the PHSELECTED signal and driving a pair of inverters 722, 724 to generate PHASEDONE a short time after PHSELECTED is generated.

Figure 16:
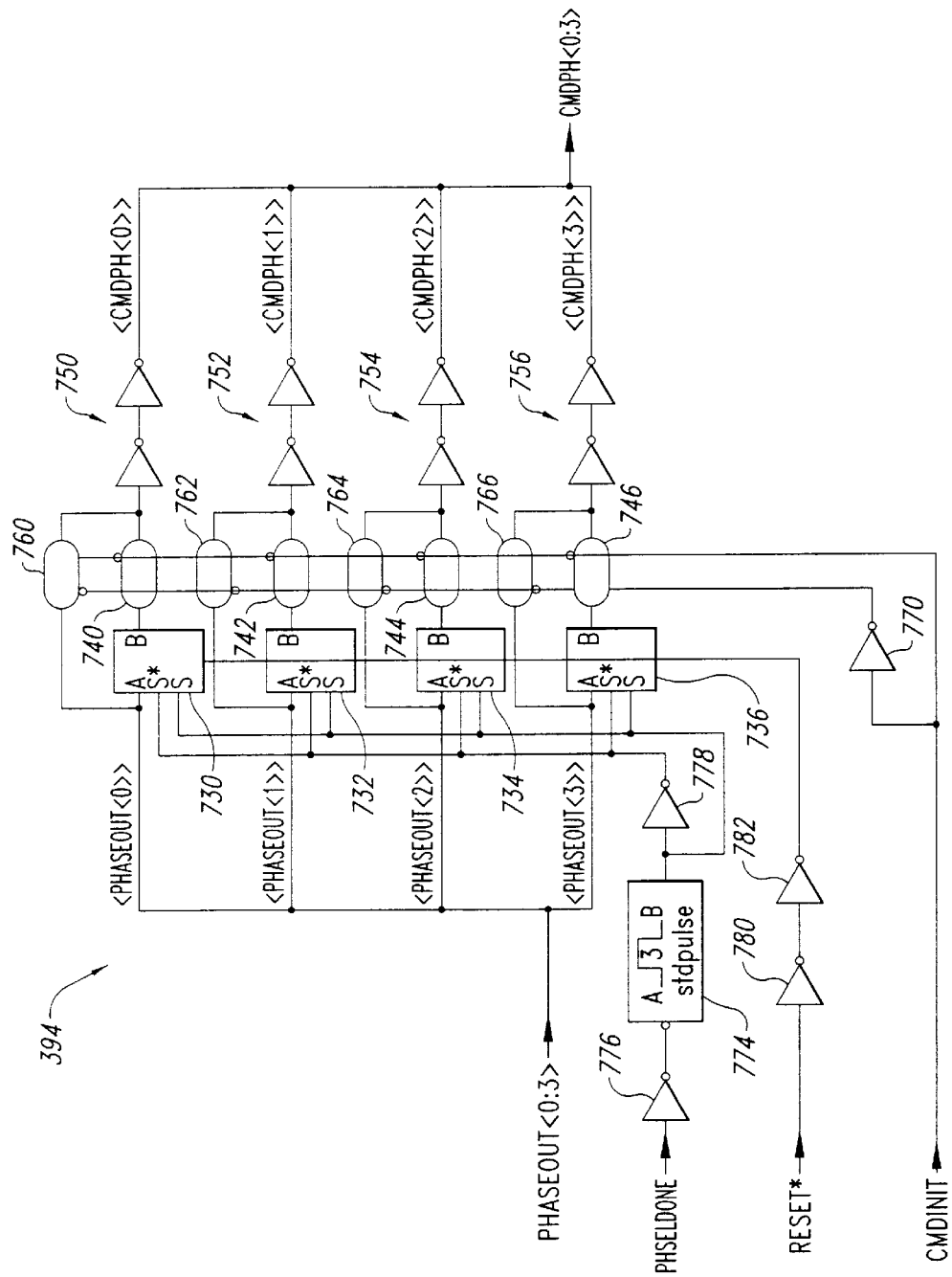
FIG. 16 is a logic diagram of a latch circuit used in the phase control circuit of FIGS. 7A and 7B.

The PHASEOUT<0:3> signals from the multiplexer 390 are applied to the latch 394 (FIG. 7B), which is shown in greater detail in FIG. 16. The PHASEOUT<0:3> signals are applied to respective latch circuits 730–736. The outputs of the latch circuits 730–736 are applied to respective pass gates 740–746 which are coupled to respective inverter pairs 750–756. The latch circuits 730–736 may be selectively bypassed by respective pass gates 760–766. The pass gates 740–746 and the pass gates 760–766 are connected to each other so that the pass gates 740–746 are enabled alternately with the pass gates 760–766.

As explained earlier, in the load mode the initiation command CMDINIT is high, thereby enabling the pass gates 760–766 directly and through an inverter 770. As a result, the latches 730–736 are bypassed in the load mode so that the phase command CMDPH<0:3> applied to the multiplexer 310 (FIG. 5) to select the tap of the delay line 260 always corresponds to PHASEOUT<0:3>. However, when the final RES<0:15> has been obtained, PHSDONE goes high, thereby triggering a pulse generator 774 thorough an inverter 776. The pulse generated by the pulse generator 774 is applied to the S inputs of the latch circuits 730–736 and its compliment is applied through an inverter 778 to the S* inputs of the latch circuits 730–736. The latch circuits 730–736 then store the PHASEOUT<0:3> signals that correspond to the P<0:3> signals selected by the multiplexer 390. The P<0:3> signals, in turn, correspond to the lowest order final result RES<0:15> containing a "1". The PHASEOUT<0:3> signals stored in the latch circuits 730–736 are then coupled to the inverter pairs 750–756 by the pass gates 740–746 since CMDINIT has gone low by this time. The latch circuits 730–736 store the PHASEOUT<0:3> signals until either new PHASEOUT<0:3> signals are stored in the latch circuits 730–736 or they are reset by the RESET* signal applied through a pair of inverters 780, 782. The CMDPH<0:3> then causes the multiplexer 310 (FIG. 5) to select the tap of the delay line 260 that will be used to generate ICLK during normal operation.

Although the preferred embodiment of the invention has been described primarily as being used to adjust the phase of an internal clock signals to accurately latch an externally applied command packet, it will be understood that it may be used for similar purposes in memory devices and other types of integrated circuits. For example, as explained above, the same system may be used to adjust the phase of an internal data clock relative to the external data clock DCLK received on line 132 (FIG. 2) to accurately latch data on the data bus 130. In fact, the system may be used to adjust the timing of clock signals to accurately latch any type of input signals applied to any type of integrated circuit. In fact, the system could be used with little additional circuitry to select a respective clock phase that could best latch every input signal that is applied to an integrated circuit. In such case, the system would sequentially evaluate every input terminal of the integrated circuit in the same manner that the command bus was evaluated to determine the optimum clock phase for capturing command packets on the command bus.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method of adaptively adjusting the phase of an internal clock signal, the method comprising:

receiving a digital signal having a plurality of transitions;

comparing transitions of the digital signal to transitions of the internal clock signal at different phases of the internal clock signal;

determining respective delay times of the digital signal relative to the internal clock signal based on each of the comparisons;

identifying each phase of the internal clock signal that resulted in a delay time within a predetermined range of delay times;

selecting one of the identified phases of the internal clock signal; and adjusting the phase of the internal clock signal to the selected phase of the internal clock signal.

2. The method of claim 1 wherein the act of selecting one of the identified phases of the internal clock signal comprises:

designating with an associated first logical value each of the phases of the internal clock signal that resulted in a delay time within the predetermined range of delay times;

designating with an associated second logical value each of the phases of the internal clock signal that resulted in a delay time outside the predetermined range of delay times;

arranging all of the logical values in a series in which each of the logical values have a position corresponding to the phases of the internal clock signal that resulted in a delay time within the predetermined range of delay times;

repetitively changing in sequence each first logical value that is to the right of a second logical value to the second logical value and each first logical value that is to the left of a second logical value to the second logical value until each of the remaining first logical values is surrounded by the second logical values; and selecting the phase of the internal clock signal to correspond to the position of a remaining first logical value.

3. The method of claim 2 wherein the first logical value comprises a logical "1" and the second logical value comprises a logical "0".

4. The method of claim 2 wherein the act of selecting the phase of the internal clock signal to correspond to the position of a remaining first logical value comprises:

examining the sequence of logical values in which each of the remaining first logical values is surrounded by the second logical values;

changing all of the first logical values in the sequence that are positioned to one side of a first logical value to the second logical value; and selecting the phase of the internal clock signal to correspond to the position of the unchanged first logical value.

5. The method of claim 1 wherein the act of comparing transitions of the digital signal to transitions of the internal clock signal at different phases of the internal clock signal comprises:

determining the value of the digital signal at a transition of the internal clock signal; and deciding if the determined value corresponds to the value of the digital signal before or after a transition of the digital signal.

6. The method of claim 5 wherein the act of deciding if the determined value corresponds to the value of the digital signal occurring before or after a transition of the digital signal comprises:

applying the digital signal to a latch;

storing the value of the digital signal responsive to a transition of the internal clock signal; and examining the value of the stored digital signal.

7. The method of claim 1 wherein the act of selecting one of the identified phases of the internal clock signal comprises selecting from among a plurality of phases of the internal clock signal that resulted in a delay time within the predetermined range of delay times.

8. The method of claim 1 wherein the act of comparing transitions of the digital signal to transitions of the internal clock signal at different phases of the internal clock signal comprises comparing a transition of the internal clock signal to transitions of the digital signal occurring before and after the transition of the internal clock signal.

9. A method of storing a digital signal, comprising:

storing values of the digital signal responsive to transitions of a clock signal at a plurality of phases of the clock signal;

examining the values of the digital signal stored at respective phases of the clock signal to determine if each of the values has a predetermined value;

based on the examination of the values, selecting one of the phases of the clock signal; and continuing to store values of the digital signal responsive to transitions of the clock signal having a phase corresponding to the selected phase.

10. The method of claim 9 wherein the act of selecting one of the phases of the clock signal comprises:

designating with an associated first logical value each of the phases of the clock signal that resulted in storing a value of the digital signal having the predetermined value;

designating with an associated second logical value each of the phases of the clock signal that resulted in storing a value of the digital signal having other than the predetermined value;

arranging all of the logical values in a series in which each of the logical values have a position corresponding to the phases of the clock signal that resulted in storing a value of the digital signal having the predetermined value;

repetitively changing in sequence each first logical value that is to the right of a second logical value to the second logical value and each first logical value that is to the left of a second logical value to the second logical value until each of the remaining first logical values is surrounded by the second logical values; and selecting the phase of the clock signal to correspond to the position of a remaining first logical value.

11. The method of claim 10 wherein the first logical value comprises a logical "1" and the second logical value comprises a logical "0".

12. The method of claim 10 wherein the act of selecting the phase of the clock signal to correspond to the position of a remaining first logical value comprises:

examining the sequence of logical values in which each of the remaining first logical values is surrounded by the second logical values;

changing all of the first logical values in the sequence that are positioned to one side of a first logical value to the second logical value; and selecting the phase of the clock signal to correspond to the position of the unchanged first logical value.

13. The method of claim 9 wherein the act of selecting one of the phases of the clock signal comprises selecting from among a plurality of phases of the internal clock signal that resulted in the storage of a value of the digital signal having the predetermined value.

14. In a packetized memory device, a method of capturing packet words in command packets that are received along with an external clock signal, comprising:

applying a plurality of initialization packet words to the memory device, each of the initialization packet word having a predetermined value;

generating an internal clock signal having one of a plurality of phases relative to the phase of the external clock signal;

storing each of the initialization packet words responsive to transitions of the internal clock signal at a plurality of the phases of the internal clock signal;

examining the values of the initialization packet words stored at respective phases of the internal clock signal to determine if each of the values of the initialization packet words has a predetermined value;

based on the examination of the values of the initialization packet words, selecting one of the phases of the internal clock signal; and storing packet words of a plurality of command packets responsive to transitions of the internal clock signal having the selected phase.

15. The method of claim 14 wherein the act of selecting one of the phases of the internal clock signal comprises:

designating with an associated first logical value each of the phases of the internal clock signal that resulted in storing a value of the initialization packet word having the predetermined value;

designating with an associated second logical value each of the phases of the internal clock signal that resulted in storing a value of the initialization packet word having other than the predetermined value;

arranging all of the logical values in a series in which each of the logical values have a position corresponding to the phase of the internal clock signal that resulted in storing a value of the initialization packet word having the predetermined value;

repetitively changing in sequence each first logical value that is to the right of a second logical value to the second logical value and each first logical value that is to the left of a second logical value to the second logical value until each of the remaining first logical values is surrounded by the second logical values; and selecting the phase of the internal clock signal to correspond to the position of a remaining first logical value.

16. The method of claim 15 wherein the first logical value comprises a logical "1" and the second logical value comprises a logical "0".

17. The method of claim 15 wherein the act of selecting the phase of the internal clock signal to correspond to the position of a remaining first logical value comprises:

examining the sequence of logical values in which each of the remaining first logical values is surrounded by the second logical values;

changing all of the first logical values in the sequence that are positioned to one side of a first logical value to the second logical value; and selecting the phase of the internal clock signal to correspond to the position of the unchanged first logical value.

18. The method of claim 14 wherein the act of selecting one of the phases of the internal clock signal comprises selecting from among a plurality of phases of the internal clock signal that resulted in the storage of a value of the initialization packet word having the predetermined value.

19. A method of using a computer system having a plurality of components, the method comprising:

coupling a digital signal from a first component of the computer system to a second component of the computer system;

coupling an external clock signal from a third component of the computer system to the second component of the computer system in approximate synchronism with the coupling of the digital signal to the second component of the computer system;

generating an internal clock signal in the second component, the internal clock signal having one of a plurality of phases relative to the phase of the external clock signal;

storing a plurality of values of the digital signal responsive to transitions of the internal clock signal at a plurality of the phases of the internal clock signal;

examining the stored values of the digital signal at respective phases of the internal clock signal to determine if each of the stored values of the digital signal has a predetermined value;

based on the examination of the stored values, selecting one of the phases of the internal clock signal; and continuing to store values of the digital signal responsive to transitions of the internal clock signal having the selected phase.

20. The method of claim 19 wherein the second component of the computer system comprises a memory device.

21. The method of claim 20 wherein the memory device comprises a packetized memory device.

22. The method of claim 21 wherein the digital signal comprises a command packet.

23. The method of claim 19 wherein the act of selecting one of the phases of the internal clock signal comprises:

designating with an associated first logical value each of the phases of the internal clock signal that resulted in storing a value of the digital signal having the predetermined value;

designating with an associated second logical value each of the phases of the internal clock signal that resulted in storing a value of the digital signal having other than the predetermined value;

arranging all of the logical values in a series in which each of the logical values have a position corresponding to the phase of the internal clock signal that resulted in storing a value of the digital signal having the predetermined value;

repetitively changing in sequence each first logical value that is to the right of a second logical value to the second logical value and each first logical value that is to the left of a second logical value to the second logical value until each of the remaining first logical values is surrounded by the second logical values; and selecting the phase of the internal clock signal to correspond to the position of a remaining first logical value.

24. The method of claim 23 wherein the first logical value comprises a logical "1" and the second logical value comprises a logical "0".

25. The method of claim 23 wherein the act of selecting the phase of the internal clock signal to correspond to the position of a remaining first logical value comprises:

examining the sequence of logical values in which each of the remaining first logical values is surrounded by the second logical values;

changing all of the first logical values in the sequence that are positioned to one side of a first logical value to the second logical value; and selecting the phase of the internal clock signal to correspond to the position of the unchanged first logical value.

26. The method of claim 19 wherein the act of selecting one of the phases of the internal clock signal comprises selecting from among a plurality of phases of the internal clock signal that resulted in the storage of a value of the digital signal having the predetermined value.

27. The method of claim 19 wherein the first component of the computer system comprises the same component as the third component of the computer system.

* * * * *

UNITED STATES PATENT AND TRADEMARK OFFICE
CERTIFICATE OF CORRECTION

PATENT NO. : 6,026,050
DATED : February 15, 2000
INVENTOR(S) : Russel Jacob Baker and Troy A. Manning It is certified that error appears in the above-identified patent and that said Letters Patent is hereby corrected as shown below:

Title page,
Item [56], OTHER PUBLICATIONS, reads "Using a Frequency- and Delay-Locked" should read -- Using a Frequency and Delay-Locked --

Column 1,
Line 55, reads "operation for the processor. The time required for" should read -- operation for the processor. The time required for --

Column 5,
Line 13, reads "DARM" should read -- DRAM --
Line 33, reads "if they were correspond to" should read -- if they correspond to --

Column 9,
Line 62, reads "264a-26n" should read -- 264a-264n --

Column 13,
Line 46, reads "LDNITRES" should read -- LDINITRES --

Column 16,
Line 6, reads "LDINITERS" should read -- LDINITRES --
Line 9, reads "As the" should read -- At the --
Line 60, reads "Similarly, The" should read -- Similarly, the --

Column 17,
Line 42, reads "transistors 420, 238" should read -- transistors 420, 428 --

Column 18,
Line 59, reads "these signal isolate" should read -- these signals isolate --

Column 19,
Line 22, reads "to Fig. 7A. The register 560" should read -- to Fig. 7A. The register 560 --

Column 20,
Line 22, reads "<0:15" should read -- <0:15> --

UNITED STATES PATENT AND TRADEMARK OFFICE
CERTIFICATE OF CORRECTION

PATENT NO.   : 6,026,050
DATED        : February 15, 2000
INVENTOR(S)  : Russel Jacob Baker and Troy A. Manning It is certified that error appears in the above-identified patent and that said Letters Patent is hereby corrected as shown below:

Column 22,
Line 58, reads "Similarly, The" should read -- Similarly, the --

Column 23,
Line 32, reads "generator 774 thorough" should read -- generator 774 through --

Signed and Sealed this

Fifth Day of August, 2003

JAMES E. ROGAN
*Director of the United States Patent and Trademark Office*